United States Patent
Park et al.

(10) Patent No.: US 8,634,236 B2
(45) Date of Patent: Jan. 21, 2014

(54) PHASE CHANGE MEMORY DEVICE, STORAGE SYSTEM HAVING THE SAME AND FABRICATING METHOD THEREOF

(75) Inventors: Hye-Young Park, Seongnam-si (KR); Jeong-Hee Park, Hwaseong-si (KR); Hyun-Suk Kwon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 141 days.

(21) Appl. No.: 13/234,924

(22) Filed: Sep. 16, 2011

(65) Prior Publication Data

US 2012/0068136 A1 Mar. 22, 2012

(30) Foreign Application Priority Data

Sep. 17, 2010 (KR) .................. 10-2010-0091985

(51) Int. Cl.
| G11C 11/00 | (2006.01) |
| G11C 5/02 | (2006.01) |
| H01L 29/06 | (2006.01) |
| H01L 21/00 | (2006.01) |
| H01L 21/06 | (2006.01) |

(52) U.S. Cl.
USPC ............ 365/163; 365/51; 365/148; 365/175; 257/4; 257/5; 257/47; 257/112; 438/95; 438/102

(58) Field of Classification Search
USPC ............ 365/148, 163, 175, 51; 257/4, 5, 47, 257/112; 438/95, 102
See application file for complete search history.

(56) References Cited

U.S. PATENT DOCUMENTS

| 8,368,178 B2 * | 2/2013 | Lee ............................. 257/594 |
| 2008/0191188 A1 * | 8/2008 | Jeong ............................ 257/4 |
| 2008/0248632 A1 * | 10/2008 | Youn et al. ................... 438/483 |

FOREIGN PATENT DOCUMENTS

| JP | 2008-091870 | 4/2008 |
| KR | 1020090014024 A | 2/2009 |
| KR | 1020090036384 A | 4/2009 |

* cited by examiner

*Primary Examiner* — Ly D Pham
(74) *Attorney, Agent, or Firm* — Myers Bigel Sibley & Sajovec, PA

(57) ABSTRACT

Provided are a phase change memory device and a fabricating method thereof. The phase change memory device includes a substrate, an interlayer dielectric layer formed on the substrate, first and second contact holes formed in the interlayer dielectric layer, and a memory cell formed in the first and second contact holes and including a diode, a first electrode on the diode, a phase change material layer on the first electrode, and a second electrode on the phase change material layer, wherein the first contact hole and the second contact hole are spaced apart from and separated from each other.

24 Claims, 34 Drawing Sheets

FIG. 1

| 10_1 | 10_2 | 10_3 | 10_4 | 10_5 | 10_6 | 10_7 | 10_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(20_1) | | SA/WD(20_2) | | SA/WD(20_3) | | SA/WD(20_4) | |
| PERIPHERY(30) | | | | | | | |
| SA/WD(20_8) | | SA/WD(20_7) | | SA/WD(20_6) | | SA/WD(20_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 10_16 | 10_15 | 10_14 | 10_13 | 10_12 | 10_11 | 10_10 | 10_9 |

PHASE CHANGE MEMORY DEVICE, STORAGE SYSTEM HAVING THE SAME AND FABRICATING METHOD THEREOF

CROSS-REFERENCE TO RELATED APPLICATION

This application claims priority from Korean Patent Application No. 10-2010-0091985 filed on Sep. 17, 2010 in the Korean Intellectual Property Office, and all the benefits accruing therefrom under 35 U.S.C. 119, the contents of which in its entirety are herein incorporated by reference.

BACKGROUND OF THE INVENTION

1. Field of the Invention

The present invention relates to a phase change memory device which can prevent or reduce misalignment from occurring between components constituting a memory cell, a storage system having the same and a fabricating method of the same.

2. Description of the Related Art

Some semiconductor memory devices may be generally classified as a volatile memory that loses stored data when applied power is interrupted and a nonvolatile memory that retains stored data in absence of applied power.

A flash memory having a stacked gate structure is typically used as a nonvolatile memory. Recently, novel nonvolatile memory devices such as phase change memory devices have been proposed instead of flash memory devices.

SUMMARY

In a phase change memory device, a unit memory cell includes a diode, a first electrode, a phase change material layer, and a second electrode, which are discrete elements formed in different layers, respectively, resulting in misalignment between the respective elements, thereby lowering the operating current characteristic of the phase change memory device and ultimately deteriorating the reliability of the phase change material layer.

The present inventive subject matter provides a phase change memory device which can prevent or reduce misalignment from occurring between various elements forming the phase change memory device.

The present inventive subject matter also provides a storage system including the phase change memory device.

The present inventive subject matter also provides a fabricating method of the phase change memory device.

According to an aspect of the present inventive subject matter, there is provided a phase change memory device that includes a substrate, an interlayer dielectric layer formed on the substrate, first and second contact holes formed in the interlayer dielectric layer, and a memory cell formed in the first and second contact holes and comprising a diode, a first electrode on the diode, a phase change material layer on the first electrode, and a second electrode on the phase change material layer, wherein the first contact hole and the second contact hole are spaced apart from and separated from each other.

According to another aspect of the present inventive subject matter, there is provided a phase change memory device including a substrate, an interlayer dielectric layer formed on the substrate, first and second contact holes formed in the interlayer dielectric layer, and a memory cell formed in the first and second contact holes and comprising a diode, a first electrode on the diode, a phase change material layer on the first electrode, a second electrode on the phase change material layer, and a resistance adjusting unit that adjusts resistance between the first electrode and the phase change material layer and having sloping surfaces, wherein the first contact hole and the second contact hole are spaced apart from and separated from each other, and the lateral surfaces of the phase change material layer and the sloping surfaces of the resistance adjusting unit have the same profile.

According to still another aspect of the present inventive subject matter, there is provided a storage system comprising: a phase change memory device, and a processor for controlling write and read operations of the phase change memory device, wherein the phase change memory device comprises a substrate, an interlayer dielectric layer formed on the substrate, first and second contact holes formed in the interlayer dielectric layer, and a memory cell formed in the first and second contact holes and comprising a diode, a first electrode on the diode, a phase change material layer on the first electrode, and a second electrode on the phase change material layer, wherein the first contact hole and the second contact hole are spaced apart from and separated from each other.

According to a further aspect of the present inventive subject matter, there is provided a fabricating method of a phase change memory device comprising providing a substrate, forming an interlayer dielectric layer on the substrate, forming first and second contact holes in the interlayer dielectric layer, and forming a memory cell in the first and second contact holes, wherein the forming of the memory cell comprises forming a diode on the substrate, forming a first electrode on the diode, forming a phase change material layer on the first electrode, and forming a second electrode on the phase change material layer.

BRIEF DESCRIPTION OF THE DRAWINGS

The above and other features and advantages of the present inventive subject matter will become more apparent by describing in detail embodiments thereof with reference to the attached drawings in which:

FIG. 1 is block diagram of a phase change memory device according to embodiments of the present inventive subject matter;

DETAILED DESCRIPTION

Figure 2:
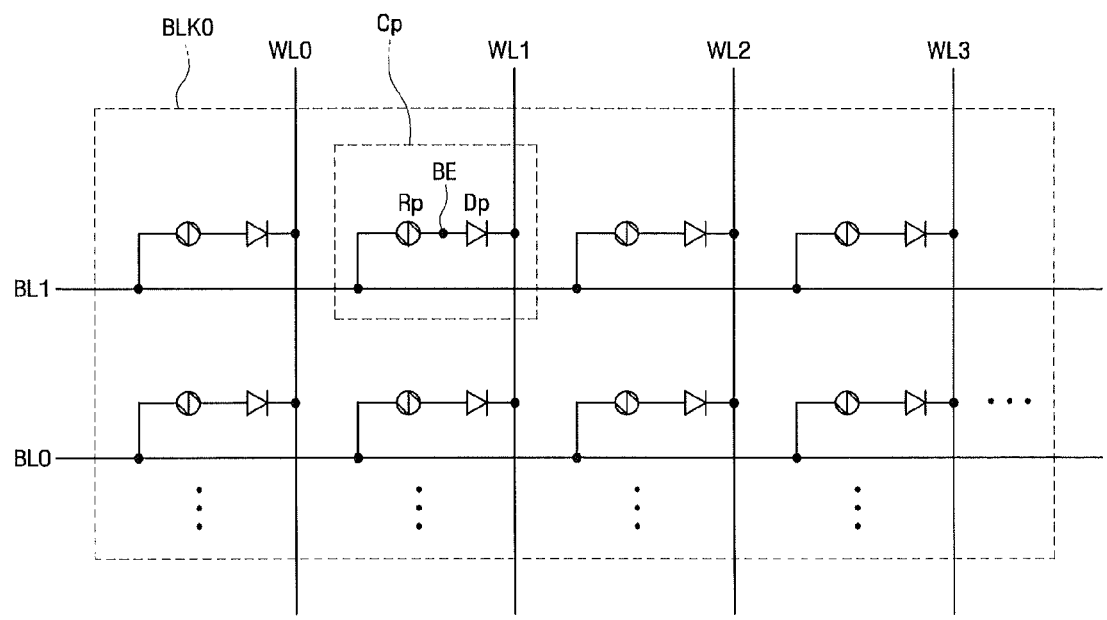
FIG. 2 a schematic circuit diagram of a phase change memory device according to embodiments of the present inventive subject matter.

Advantages and features of the present inventive subject matter and methods of accomplishing the same may be understood more readily by reference to the following detailed description of preferred embodiments and the accompanying drawings. The present inventive subject matter may, however, be embodied in many different forms and should not be construed as being limited to the embodiments set forth herein. Rather, these embodiments are provided so that this disclosure will be thorough and complete and will fully convey the concept of the inventive subject matter to those skilled in the art, and the present inventive subject matter will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive subject matter.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

Embodiments described herein will be described referring to plan views and/or cross-sectional views by way of ideal schematic views of the inventive subject matter. Accordingly, the exemplary views may be modified depending on manufacturing technologies and/or tolerances. Therefore, the embodiments of the inventive subject matter are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the inventive subject matter.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, phase change memory devices according to some embodiments of the present inventive subject matter and fabricating methods thereof will be described with reference to FIGS. 1 through 31.

First, operating characteristics of a phase change memory device according to embodiments of the present inventive subject matter will be described with reference to FIGS. 1 and 2. FIG. 1 is block diagram of a phase change memory device according to embodiments of the present inventive subject matter, and FIG. 2 a schematic circuit diagram of a phase change memory device according to embodiments of the present inventive subject matter.

First, referring to FIG. 1, the phase change memory device comprises a plurality of memory banks (inclusive of 10_1 through 10_16), a plurality of sense amplifier and write drivers (inclusive of 20_1 to 20_8), and a peripheral circuit region 30.

Each of the plurality of memory banks 10_1 through 10_16 is formed of a plurality of memory blocks BLK0 to BLK7. Each of the memory banks 10_1 through 10_16 may include a plurality of nonvolatile memory cells, which are arranged in a matrix form. In the example embodiments of the present inventive subject matter, each memory bank is formed of eight (8) memory blocks, but other memory bank configurations may be used.

Although not shown in the figures, the phase change memory device may further comprise a row selector circuit and a column selector circuit in each memory bank to select rows and columns of nonvolatile memory cells to be accessed.

Sense amplifier and write driver blocks 20_1~20_8 are disposed to correspond to two memory banks 10_1~10_16 and perform read and write operations of the corresponding memory banks. While the embodiments of the present inventive subject matter are illustrated with the sense amplifier and write driver blocks 20_1~20_8 corresponding to two memory banks 10_1~10_16, the inventive subject matter is not limited thereto. That is to say, the sense amplifier and write driver blocks 20_1~20_8 may be disposed to correspond to one or four memory banks.

The peripheral circuit region 30 may include a voltage generator and a plurality of logic circuit blocks for operating the column decoder, the row decoder, and the sense amplifier and write driver blocks 20_1~20_8.

Referring to FIG. 2, the memory block BLK0 of the phase change memory device according to the embodiments of the present inventive subject matter may include a plurality of nonvolatile memory cells Cp, a plurality of bit lines BL0 and BL1, and a plurality of word lines WL0~WL3.

The plurality of nonvolatile memory cells Cp are arranged at intersections between the word lines WL0~WL3 and bit lines BL0 and BL1. The nonvolatile memory cell Cp includes a phase change element Rp changing into a crystalline state and an amorphous state according to the current flowing via the phase change element Rp and having different resistance values, and a vertical cell diode Dp element controlling the current flowing via the phase change element Rp. Here, the phase change element Rp may be formed of various phase change materials including two-element compounds, such as GaSb, InSb, InSe, SbTe, or GeTe, three-element compounds, such as GeSbTe, GaSeTe, InSbTe, $SnSb_2Te_4$, or InSbGe, four-element compounds, such as AgInSbTe, (GeSn)SbTe, GeSb(SeTe), $Te_{81}Ge_{15}Sb_2S_2$, and the like. Among such materials, GeSbTe consisting of Ge, Sb, and Te may be included mainly in the phase change element Rp. The phase change element Rp included in the nonvolatile memory cell Cp according to the present inventive subject matter will later be described in detail.

In the illustrated embodiment, the phase change element Rp is coupled to the bit lines BL0 and BL1 and the vertical cell diode Dp is coupled to the word lines WL0~WL3. However, the phase change element Rp may be coupled to the word lines WL0~WL3 and the vertical cell diode Dp may be coupled to the bit lines BL0 and BL1.

The operation of the phase change memory device according to the embodiments of the present inventive subject matter will now be described with reference to FIG. 2.

First, a write operation of the phase change memory device according to the embodiments of the present inventive subject matter will be described.

The phase change element Rp is typically converted to an amorphous state of logic level "1" by heating a phase change material to above a predetermined melting temperature Tm and then quickly cooling the phase change material, or a crystalline state of logic level "0" by heating the phase change material at a crystallization temperature Tx below the melting temperature Tm, maintaining the crystallization temperature Tx for a period of time, and then cooling the phase change material. Here, to change the phase of the phase change element Rp, a considerably large write current should be supplied to the phase change element Rp. For example, a write current of approximately 1 milli-ampere (mA) is supplied to reset the phase change element Rp, and a write current of approximately 0.6 to 0.7 mA is supplied to set the phase change element Rp. The write current is supplied from a write circuit (not shown) and is output to the word lines WL0~WL3 via the bit lines BL0 and BL1, the vertical cell diode Dp and the phase change element Rp.

A read operation of the phase change memory device according to the embodiments of the present inventive subject matter will now be described.

A read current, the phase of which is not changed, is supplied to the phase change element Rp to read data stored in a memory cell. The read current is supplied from a read circuit (not shown) and then transferred to the word lines WL0 and WL1 via the bit lines BL0~BL3, the vertical cell diode Dp, and the phase change element Rp.

Figure 3:
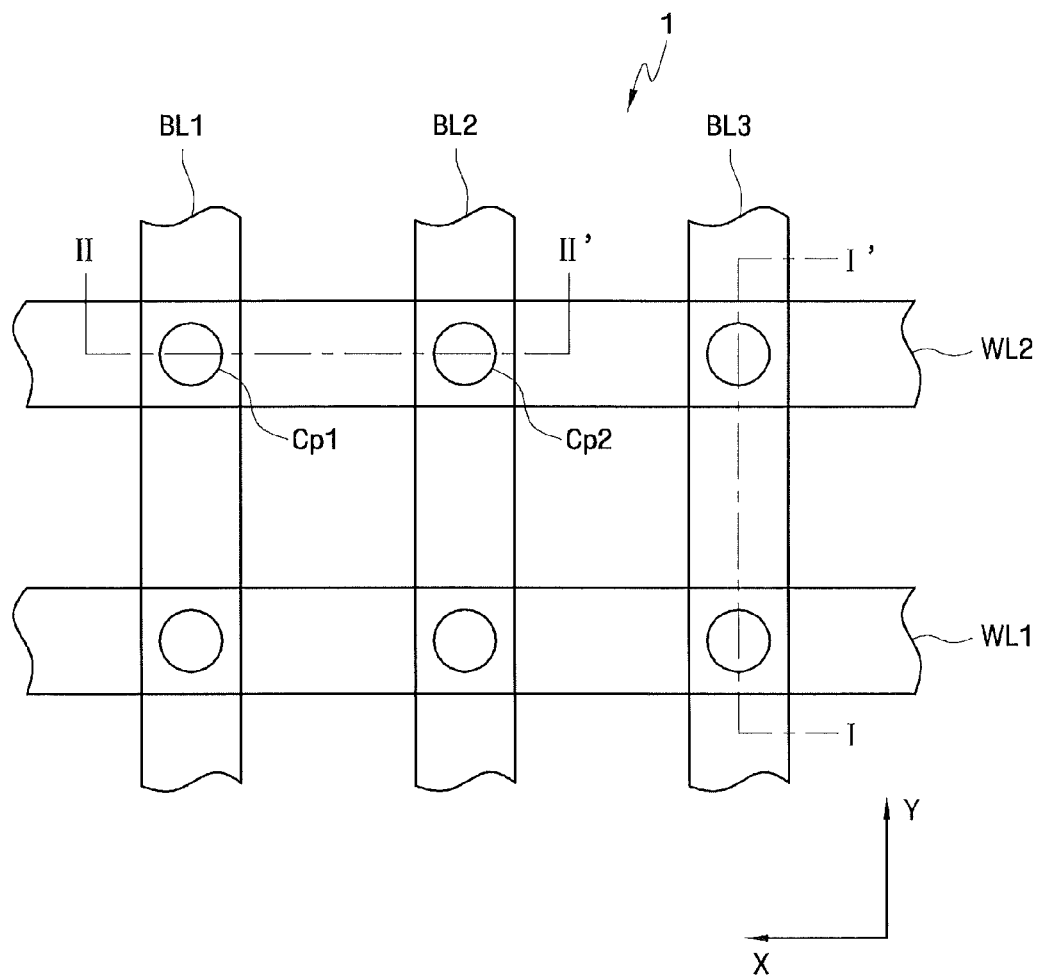
FIG. 3 is a plan view illustrating a portion of a memory cell array region of a phase change memory device according to embodiments of the present inventive subject matter.

Next, a phase change memory device according to embodiments of the present inventive subject matter will be described with reference to FIGS. 3, 4A and 5. FIG. 3 is a plan view illustrating a portion of a memory cell array region of a phase change memory device according to embodiments of the present inventive subject matter, FIG. 4A is a cross-sectional view taken along the line I-I' of FIG. 3 illustrating the phase change memory device according to a first embodiment of the present inventive subject matter, and FIG. 5 is a cross-sectional view taken along the line II-II' of FIG. 3 illustrating the phase change memory device according to the first embodiment of the present inventive subject matter.

Figure 4A:
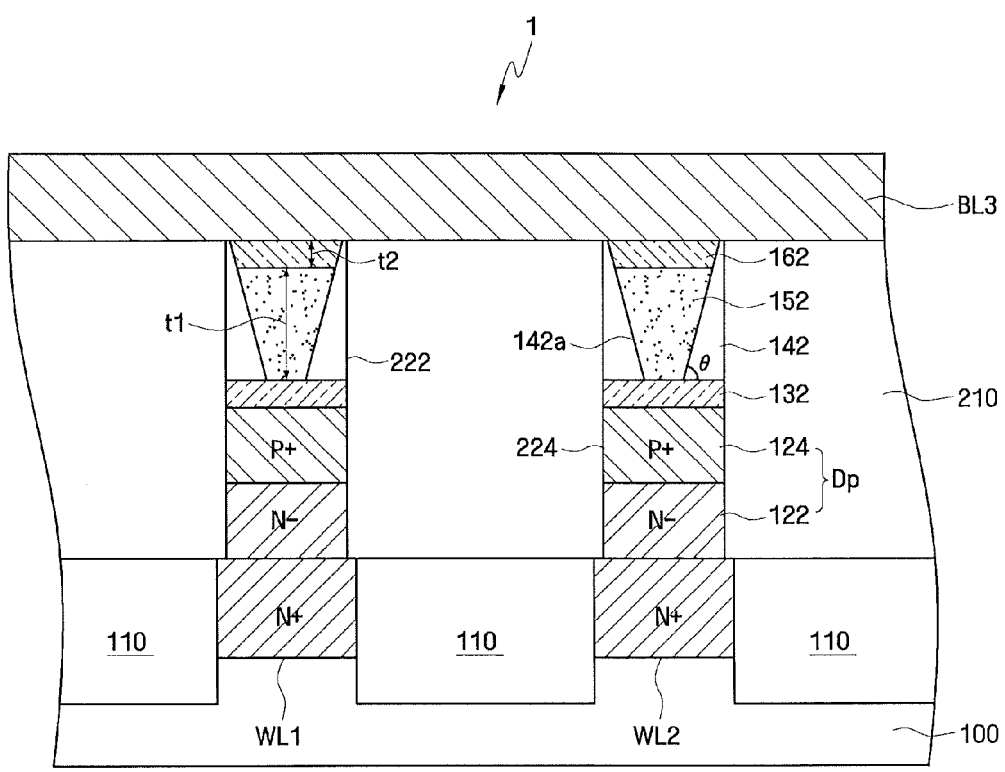
FIG. 4A is a cross-sectional view taken along the line I-I' of FIG. 3 illustrating the phase change memory device according to a first embodiment of the present inventive subject matter.
Figure 5:
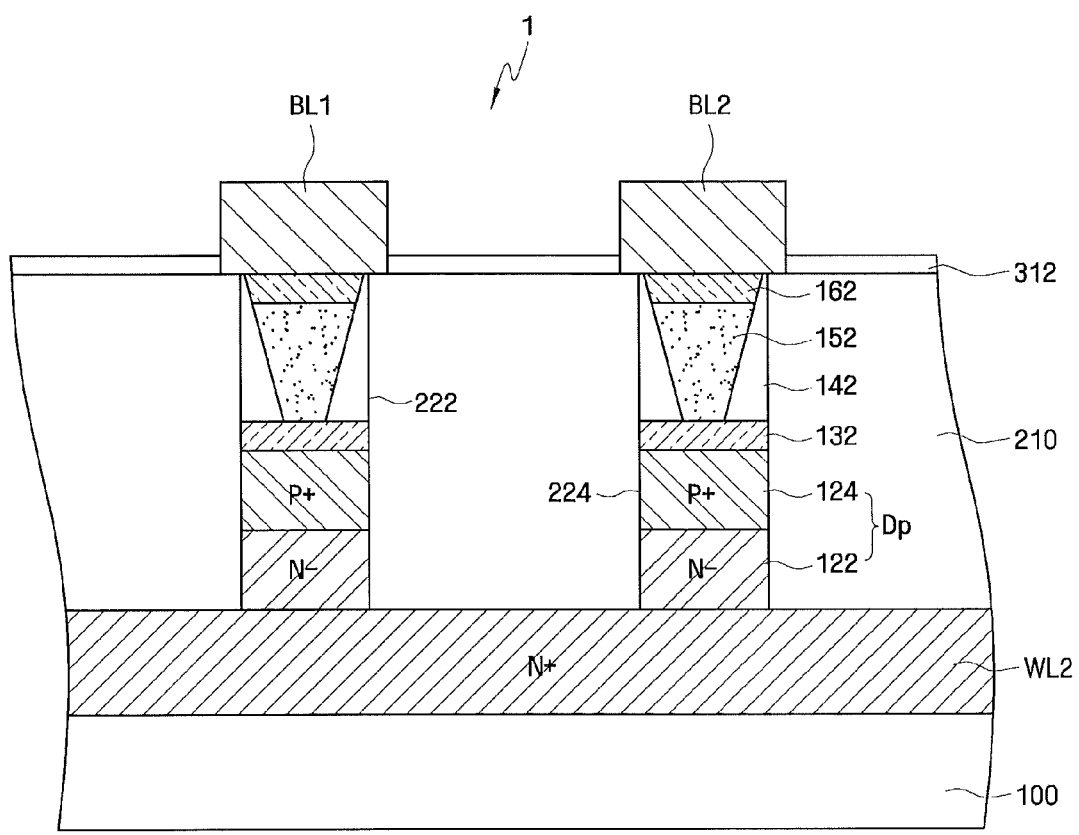
FIG. 5 is a cross-sectional view taken along the line II-II' of FIG. 3 illustrating the phase change memory device according to the first embodiment of the present inventive subject matter.

Referring to FIGS. 3, 4A and 5, word lines WL1 and WL2 extending in a first direction X and bit lines BL1~BL3 extending in a second direction Y are formed on a substrate 100. A memory cell Cp is provided at each of intersections of the word lines WL1 and WL2 and the bit lines BL1~BL3.

In the first embodiment of the present inventive subject matter, the memory cell Cp may include, for example, a phase change memory material. Here, one end of the memory cell Cp is connected to each of the bit lines BL1~BL3 and the other end of the word lines WL1 and WL2. Selector devices that select a phase change material are positioned between the phase change material of the memory cell Cp and the word lines WL1 and WL2.

The word lines WL1 and WL2 may be formed by doping n-type impurities into a semiconductor substrate 100, for example. Alternatively, the word lines WL1 and WL2 may include, but are not limited to, metals, conductive metal nitride, conductive metal oxide, conductive oxinitride, silicide, metal alloys, or combinations thereof.

Two neighboring word lines WL1 and WL2 may be electrically insulated from each other by an insulation structure such as a shallow trench isolation (STI) structure 110.

Referring to FIGS. 3, 4A, and 5, the phase change memory device 1 may include a substrate 100, an interlayer dielectric layer 210, first and second contact holes 222 and 224 formed in the interlayer dielectric layer 210, and a memory cell Cp formed in each of the first and second contact holes 222 and 224.

The substrate 100 may include, but is not limited to, a silicon substrate, a silicon on insulator (SOI) substrate, a gallium arsenic substrate, a silicon germanium substrate, and/or combinations thereof.

The interlayer dielectric layer 210 is formed on the substrate 100. The interlayer dielectric layer 210 may be a silicon oxide (SiOx), for example, a flowable oxide (FOX) layer, a torene silazene (TOSZ) layer, a undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate (FSG) layer, a high density plasma (HDP) layer, or the like.

The first and second contact holes 222 and 224 exposing portions of the substrate 100 are formed in the interlayer dielectric layer 210. The first and second contact holes 222 and 224 may be formed at regions of the interlayer dielectric layer 210 overlapping the intersections of the word lines WL1 and WL2 and the bit lines BL1~BL3. Meanwhile, the first and second contact holes 222 and 224 may be spaced a predetermined distance apart and separated from the interlayer dielectric layer 210. Accordingly, the memory cells Cp formed in the first and second contact holes 222 and 224 are separated from each other. That is to say, because the first and second contact holes 222 and 224 are separated from each other, elements constituting the memory cells Cp are separated from each other.

The memory cell Cp, including a vertical cell diode Dp, a first electrode 132, a phase change material layer 152 including a phase change material, and a second electrode 162, is formed in each of the first and second contact holes 222 and 224.

The vertical cell diode Dp may include a first semiconductor pattern 122 and a second semiconductor pattern 124. In a case where information is stored in the memory cell Cp, the vertical cell diode Dp allows a write current applied through the bit lines BL1~BL3 to flow from the first electrode 132 to the second electrode 162. The first semiconductor pattern 122 and the second semiconductor pattern 124 may have different conductivity types. For example, if the first semiconductor pattern 122 has a first conductivity type (for example, N⁻ type), the second semiconductor pattern 124 may have a second first conductivity type (for example, P⁺ type).

The first electrode 132 is positioned on the vertical cell diode Dp. The first electrode 132 may be made of, for example, titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON) and/or tantalum oxynitride (TaON).

Although not shown, an ohmic layer may be positioned between the first electrode 132 and the second semiconductor pattern 124 of the vertical cell diode Dp. The ohmic layer may improve an electrical contact characteristic between the first electrode 132 that is a conductive material and the second semiconductor pattern 124 that is a semiconducting material. The ohmic layer may be formed of, for example, silicide.

The phase change material layer 152 is positioned on the first electrode 132. The phase change material layer 152 may include materials of various kinds, including, but not limited to, a binary (two-element) compound such as GaSb, InSb, InSe, SbTe, or GeTe, a ternary (three-element) compound such as GeSbTe, GaSeTe, InSbTe, SnSb$_2$Te$_4$, or InSbGe, or a quaternary (four-element) compound, such as AgInSbTe, (GeSn)SbTe, GeSb (SeTe), or Te$_{81}$Ge$_{15}$Sb$_2$S$_2$. Specifically, a material having an amorphous state resistance value of, for example, approximately 1 MΩ or greater, may be selected as the material forming the phase change material layer 152. The most typically used phase-change material may include GeSbTe, GeBiTe, or GeSbTe doped with carbon (C) or nitrogen (N).

The second electrode 162 may be positioned on the phase change material layer 152. The second electrode 162 may be formed of the same material as the material forming the first electrode 142, but not limited thereto. That is to say, the second electrode 162 may be made of, for example, titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON) and/or tantalum oxynitride (TaON).

Meanwhile, the memory cell Cp may further include a spacer 142 disposed between sidewalls of the first and second contact holes 222 and 224 and the phase change material layer 152. The spacer 142 may be formed of, for example, a nitride or oxide layer.

Meanwhile, the spacer 142 may be formed to protrude from the sidewalls of the contact holes 222 and 224 toward interior portions the contact holes 222 and 224. Here, the extent in which the spacer 142 protrudes may gradually decrease from the first electrode 132 to the second electrode 162. That is to say, the spacer 142 may have sloping surfaces 142a contacting the phase change material layer 152.

Here, the sloping surfaces 142a may form an acute angle (θ) with the top surface of the first electrode 132. That is to say, when sectionally viewed, the spacer 142 may be shaped of, for example, a right-angled triangle having the sloping surfaces 142a as hypotenuses and the sidewalls of the contact holes 222 and 224 as a height. Here, it is assumed that the section of the spacer 142 is taken along the lengthwise direction of the contact holes 222 and 224.

Here, the acute angle θ may be 80° or less. If the acute angle θ exceeds 80°, a gap-fill characteristic may deteriorate when the phase change material layer 152 is formed in the contact holes 222 and 224, thereby undesirably forming voids or seams in the phase change material layer 152. Accordingly, the phase change material layer 152 may demonstrate a non-uniform resistance dispersion, thereby lowering the reliability of the phase change memory device 1.

Meanwhile, the phase change material layer 152 may fill a space formed by the spacer 142, and lateral surfaces of the phase change material layer 152 contact the sloping surfaces 142a of the spacer 142. Accordingly, the lateral surfaces of the phase change material layer 152 and the sloping surfaces 142a of the spacer 142 may have the same profile. That is to say, a width of the phase change material layer 152 may gradually increase from the first electrode 132 to the second electrode 162. That is to say, the width of the phase change material layer 152 contacting the first electrode 132 may be smaller than that of the phase change material layer 152 contacting the second electrode 162. As shown in FIGS. 4A and 5, a section of the phase change material layer 152 may be shaped of, for example, a trapezoid. Here, it is assumed that the section of the phase change material layer 152 is taken along the lengthwise direction of the contact holes 222 and 224.

The first electrode 132 may function as a heater electrode that applies heat to the phase change material layer 152 to cause a phase change to the phase change material layer 152. The smaller the contact area between the first electrode 132 and the phase change material layer 152, the larger the resistance therebetween. Thus, the phase change may be caused to the phase change material layer 152 even by a small operating current. Accordingly, the spacer 142 may function as a resistance adjusting unit that adjusts the resistance between the phase change material layer 152 and the first electrode 132. Here, the contact area between the first electrode 132 and the phase change material layer 152 may be smaller than an area of the first electrode 132.

Meanwhile, the second electrode 162 may also be positioned within the space formed by the spacer 142. That is to say, the spacer 142 may be disposed between the sidewalls of the contact holes 222 and 224 and the second electrode 162. Here, the lateral surfaces of the second electrode 162 may contact the sloping surfaces of the spacer 142. Accordingly, the lateral surfaces of the second electrode 162 and the sloping surfaces of the spacer 142 may have the same profile. That is to say, a width of the second electrode 162 may gradually increase toward a top portion of the interlayer dielectric layer 210. As shown in FIGS. 4A and 5, a cross-section of the second electrode 162 may be shaped of, for example, a trapezoid. Here, it is assumed that the section of the second electrode 162 is taken along the lengthwise direction of the contact holes 222 and 224. In this case, the lateral surfaces of the second electrode 162 and the phase change material layer 152 may have a continuous profile.

Meanwhile, a ratio of a thickness t2 of the second electrode 162 to a thickness t1 of the phase change material layer 152, that is, t2/t1, may be equal to or less than 1. More specifically, the second electrode 162 and the phase change material layer 152 may be formed in a space extending from the first electrode 132 to top portions of the contact holes 222 and 224 such that the thickness t2 of the second electrode 162 is equal to or less than the thickness t1 of the phase change material layer 152.

To reduce an operating current of the phase change memory device 1 and cause a rapid phase change of the phase change material layer 152, it is generally preferable to minimize the heat included in the phase change material layer 152 from being emitted to the outside. The heat included in the phase change material layer 152 may be transferred to the second electrode 162 made of a conductive material. For the phase change material layer 152 to obtain sufficient heat capacity, the material layer 152 may be larger than the second electrode 162. Specifically, if the thickness t2 of the second electrode 162 is equal to or less than 0.5 times of the thickness t1 of the phase change material layer 152, it is possible to minimize the heat included in the phase change material layer 152 from being transferred to the second electrode 162. Accordingly, the operating current of the phase change memory device 1 can be reduced and a phase change of the phase change material layer 152 can be performed rapidly.

The phase change memory device 1 may further include an etch stop layer 312 on the interlayer dielectric layer 210.

The bit lines BL1~BL3 may be formed on the memory cell Cp. The bit lines BL1~BL3 may be formed to intersect with the word lines WL1 and WL2. The bit lines BL1~BL3 are electrically connected to the second electrode 162 of the memory cell Cp. Meanwhile, a material forming the bit lines BL1~BL3 may include aluminum (Al) or tungsten (W).

Figure 4B:
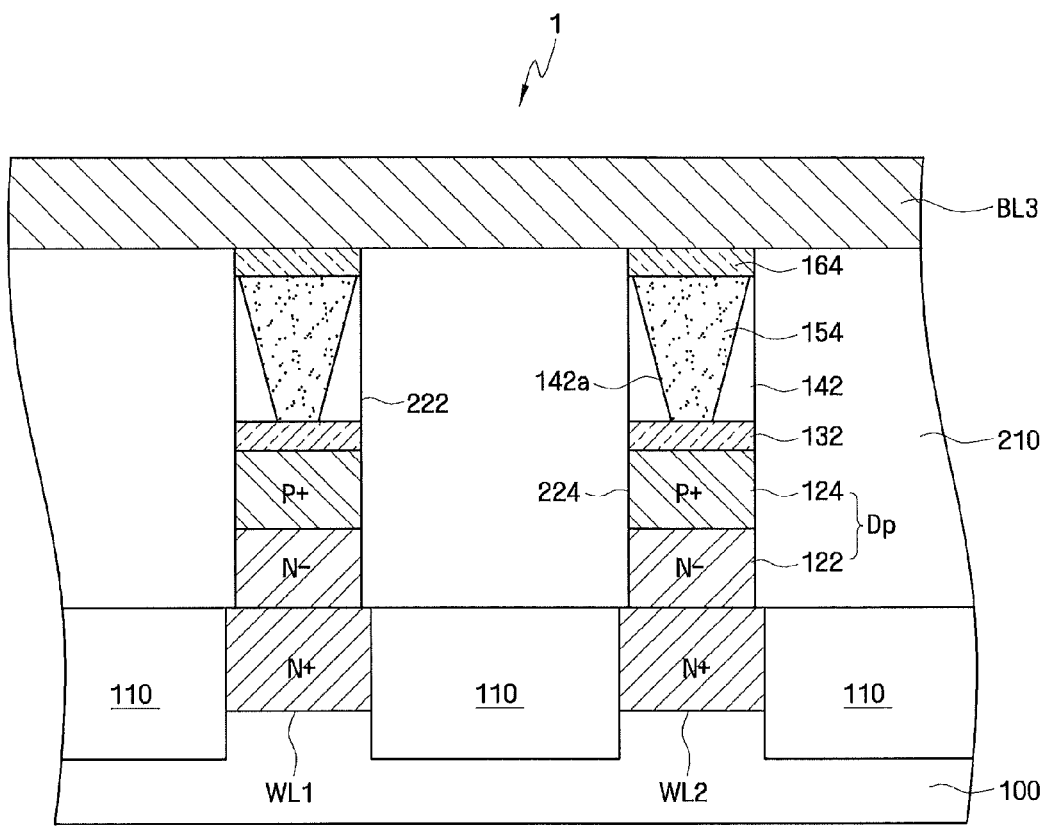
FIG. 4B is a cross-sectional view taken along the line I-I' of FIG. 3 illustrating a phase change memory device according to a first modification embodiment of the present inventive subject matter.

A first modification embodiment of the first embodiment of the present inventive subject matter (to be referred to as a first modified example, hereinafter) will be described with reference to FIGS. 3 and 4B. FIG. 4B is a cross-sectional view taken along the line I-I' of FIG. 3 illustrating a phase change memory device according to a first modification embodiment of the present inventive subject matter. For convenience of explanation, substantially the same functional components as those of the previous embodiment are denoted by the same reference numerals and detailed descriptions thereof will be omitted. The phase change memory device according to the first modified example, as shown in FIG. 4B, basically has the same configuration as the phase change memory device according to the first embodiment except for the following differences.

Referring to FIG. 4B, unlike in the first embodiment, in the first modified example, the second electrode 164 is not positioned within a space formed by the spacer 142. That is to say, the spacer 142 is not disposed between the second electrode 164 and the sidewalls of the contact holes 222 and 224. Accordingly, the lateral surfaces of the second electrode 164 may directly contact the sidewalls of the contact holes 222 and 224. In addition, the second electrode 164 may be formed to have the same width as the contact holes 222 and 224.

Accordingly, the sidewalls of the contact holes 222 and 224 and the lateral surfaces of the second electrode 164 may have substantially the same profile. As shown in FIG. 4B, when sectionally viewed, the second electrode 164 may be shaped as, for example, a rectangle. Here, it is assumed that the section of the second electrode 164 is taken along the lengthwise direction of the contact holes 222 and 224.

Figure 4C:
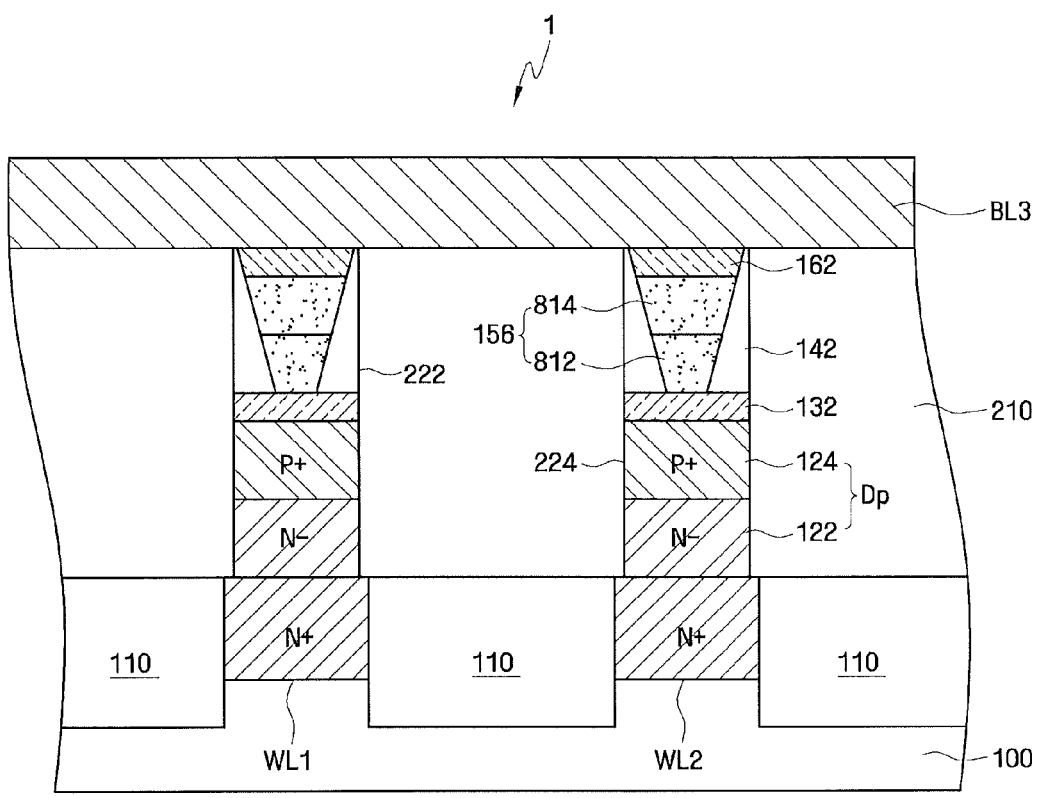
FIG. 4C is a cross-sectional view taken along the line I-I' of FIG. 3 illustrating a phase change memory device according to a second modification embodiment of the present inventive subject matter.

A second modification embodiment of the first embodiment of the present inventive subject matter (to be referred to as a second modified example, hereinafter) will be described with reference to FIGS. 3 and 4C. FIG. 4C is a cross-sectional view taken along the line I-I' of FIG. 3 illustrating a phase change memory device according to a second modification embodiment of the present inventive subject matter. For convenience of explanation, substantially the same functional components as those of the first embodiment are denoted by the same reference numerals and detailed descriptions thereof will be omitted. The phase change memory device according to the second modified example, as shown in FIG. 4C, basically has the same configuration as the phase change memory device according to the first embodiment except for the following differences.

Referring to FIG. 4C, a phase change material layer 156 according to the second modified example may include a first phase change material pattern 812 and a second phase change material pattern 814.

Here, the first phase change material pattern 812 may include materials of various kinds, including a binary (two-element) compound such as GaSb, InSb, InSe, SbTe, or GeTe, a ternary (three-element) compound such as GeSbTe, GaSeTe, InSbTe, $SnSb_2Te_4$, or InSbGe, or a quaternary (four-element) compound such as AgInSbTe, (GeSn)SbTe, GeSb(SeTe), or $Te_{81}Ge_{15}Sb_2S_2$. Specifically, a material having an amorphous state resistance value of, for example, approximately 1 MΩ or greater, may be selected as the material forming the the first phase change material pattern 812. The most typically used phase-change material may include GeSbTe, GeBiTe, or GeSbTe doped with carbon (C) or nitrogen (N).

Meanwhile, the second phase change material pattern 814 may include materials of various kinds, including a binary (two-element) compound such as GaSb, InSb, InSe, SbTe, or GeTe, a ternary (three-element) compound such as GeSbTe, GaSeTe, InSbTe, SnSb$_2$Te$_4$, or InSbGe, or a quaternary (four-element) compound such as AgInSbTe, (GeSn)SbTe, GeSb(SeTe), or Te$_{81}$Ge$_{15}$Sb$_2$S$_2$. Specifically, a material having an amorphous state resistance value of, for example, approximately 1 MΩ or greater, may be selected as the material forming the second phase change material pattern 814. The most typically used material may include GeSbTe, GeBiTe, or GeSbTe doped with carbon (C) or nitrogen (N).

During a program operation for storing data in the memory cell Cp, to allow resistance values by the first phase change material pattern 812 and the second phase change material pattern 814 to be noticeably distributed, the first phase change material pattern 812 and the second phase change material pattern 814 may be made of different materials. In particular, the first phase change material pattern 812 and the second phase change material pattern 814 may be selected so as to make the resistance value of the second phase change material pattern 814 in an amorphous state greater than that of the first phase change material pattern 812 in an amorphous state.

Alternatively, during a program operation for storing data in the memory cell Cp, to allow resistance values by the first phase change material pattern 812 and the second phase change material pattern 814 to be noticeably distributed, the first phase change material pattern 812 and the second phase change material pattern 814 may be formed to have different volumes. For example, the second phase change material pattern 814 may have a greater volume than the first phase change material pattern 812. This is for the purpose of forming the second phase change material pattern 814 having variable amorphous region sizes. Accordingly, a program region may be variably formed in the second phase change material pattern 814, thereby increasing the storage capacity of a unit cell. As described above, since the phase change material layer 156 includes the first and second phase change material patterns 812 and 814 having different properties, the memory cell Cp may achieve a multi-level cell (MLC).

Figure 6A:
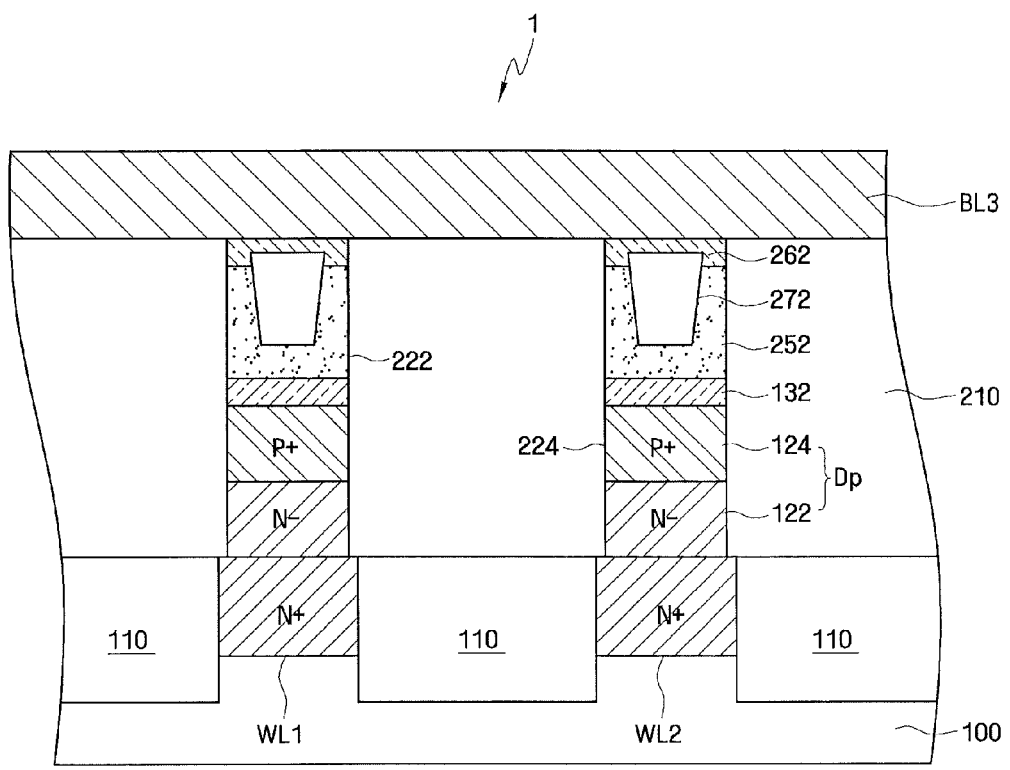
FIG. 6A is a cross-sectional view taken along the line I-I' of FIG. 3 illustrating a phase change memory device according to a second embodiment of the present inventive subject matter.
Figure 7:
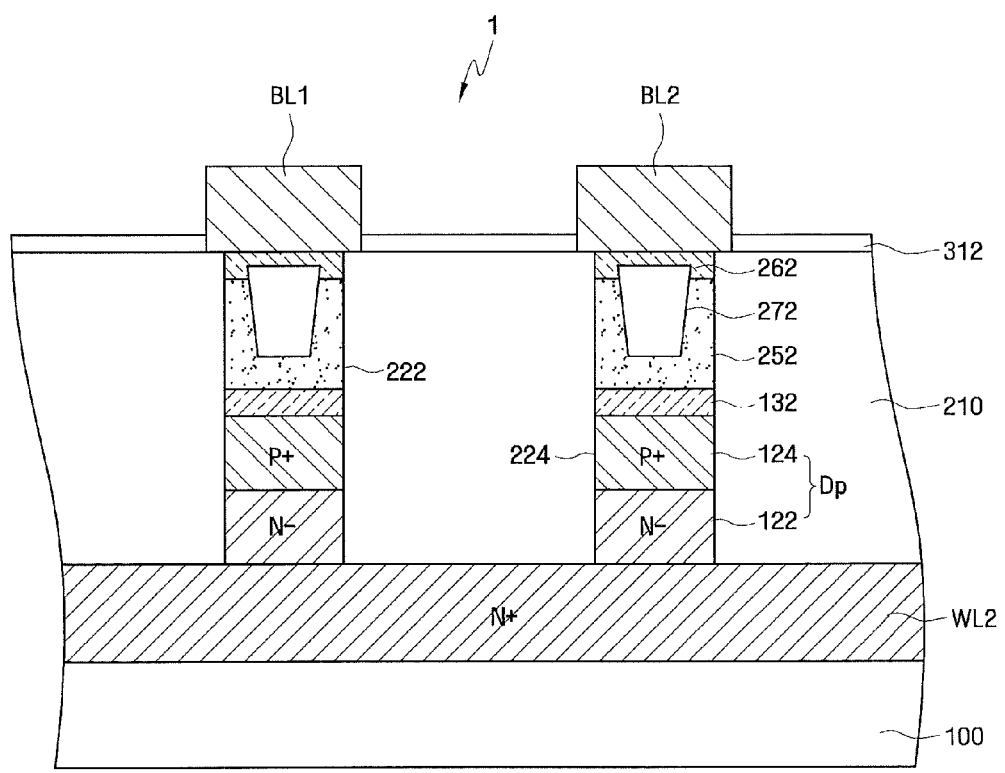
FIG. 7 is a cross-sectional view taken along the line II-II' of FIG. 3 illustrating the phase change memory device according to the second embodiment of the present inventive subject matter.

A phase change memory device according to a second embodiment of the present inventive subject matter will now be described with reference to FIGS. 3, 6A and 7. FIG. 6A is a cross-sectional view taken along the line I-I' of FIG. 3 illustrating a phase change memory device according to a second embodiment of the present inventive subject matter, and FIG. 7 is a cross-sectional view taken along the line II-II' of FIG. 3 illustrating the phase change memory device according to the second embodiment of the present inventive subject matter. For convenience of explanation, substantially the same functional components as those of the first embodiment are denoted by the same reference numerals and detailed descriptions thereof will be omitted.

Referring to FIGS. 6A and 7, a spacer (142 of FIG. 4A) is not included in the memory cell Cp according to the second embodiment of the present inventive subject matter, unlike in the memory cell Cp according to the first embodiment. Instead, the memory cell Cp according to the second embodiment may include a heat loss preventing unit 272 positioned between a phase change material layer 252 and a second electrode 262. A bottom portion of the heat loss preventing unit 272 is surrounded by the phase change material layer 252, and a top portion thereof is surrounded by the second electrode 262. Here, the top portion of the heat loss preventing unit 252 may be formed at a higher level than a boundary between the phase change material layer 252 and the second electrode 262.

Meanwhile, the heat loss preventing unit 272 prevents the heat included in the phase change material layer 252 from being emitted to the outside. Accordingly, the phase change material layer 252 can obtain sufficient heat capacity, thereby reducing the operating current of the phase change memory device 1 and causing a rapid phase change of the phase change material layer 252. The heat loss preventing unit 272 may be formed of, for example, boron-doped silicon oxide (BSG), phosphorous-doped oxide (PSG), boron and phosphorous-doped oxide (BPSG), carbon-doped silicon oxide, hydrogen silsesquioxane (HSQ), methylsilsesquioxane (MSQ), SILK, polyimide, polynorbornene, polymer dielectric material, or a low-k material.

Meanwhile, the phase change material layer 252 according to the second embodiment may have, for example, a U-shaped section. Here, it is assumed that the section of the phase change material layer 252 is taken along the lengthwise direction of the contact holes 222 and 224. The phase change material layer 252 and the second electrode 262 according to the second embodiment are quite different from the phase change material layer 252 and the second electrode 262 according to the first embodiment, in view of shapes, but are substantially the same as the phase change material layer 252 and the second electrode 262 according to the first embodiment in view of functions and materials. Thus, a repeated description will not be given.

Figure 6B:
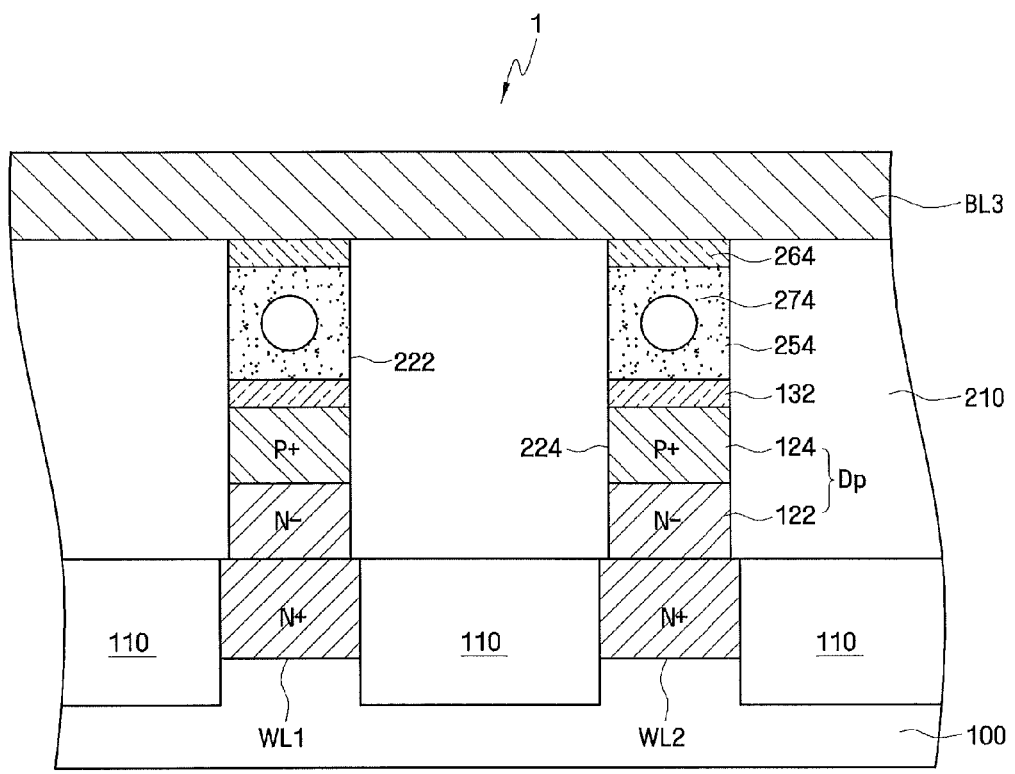
FIG. 6B is a cross-sectional view taken along the line I-I' of FIG. 3 illustrating a phase change memory device according to a third modification embodiment of the present inventive subject matter.

A first modification embodiment of the second embodiment of the present inventive subject matter (to be referred to as a third modified example, hereinafter) will be described with reference to FIGS. 3 and 6B. FIG. 6B is a cross-sectional view taken along the line I-I' of FIG. 3. For convenience of explanation, substantially the same functional components as those of the second embodiment are denoted by the same reference numerals and detailed descriptions thereof will be omitted.

The phase change memory device according to the third modified example, as shown in FIG. 6B, basically has the same configuration as the phase change memory device according to the second embodiment except for the following differences.

Referring to FIG. 6B, a heat loss preventing unit 274 according to the third modified example is positioned in a phase change material layer 254 and has an air gap having a surface surrounded by the phase change material layer 254. In a case where the heat loss preventing unit 274 includes the air gap, because the dielectric constant of the air gap is relatively low, it is possible to effectively prevent the heat included in the phase change material layer 254 from being emitted to the outside.

Figure 8A:
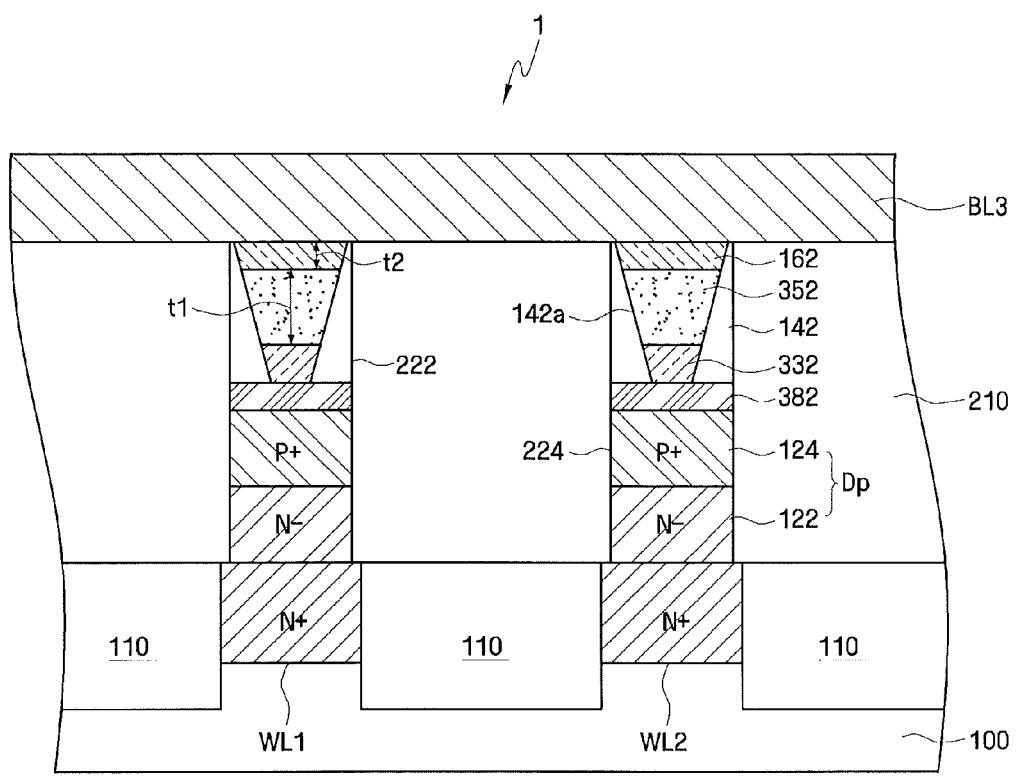
FIG. 8A is a cross-sectional view taken along the line I-I' of FIG. 3 illustrating a phase change memory device according to a third embodiment of the present inventive subject matter.
Figure 9:
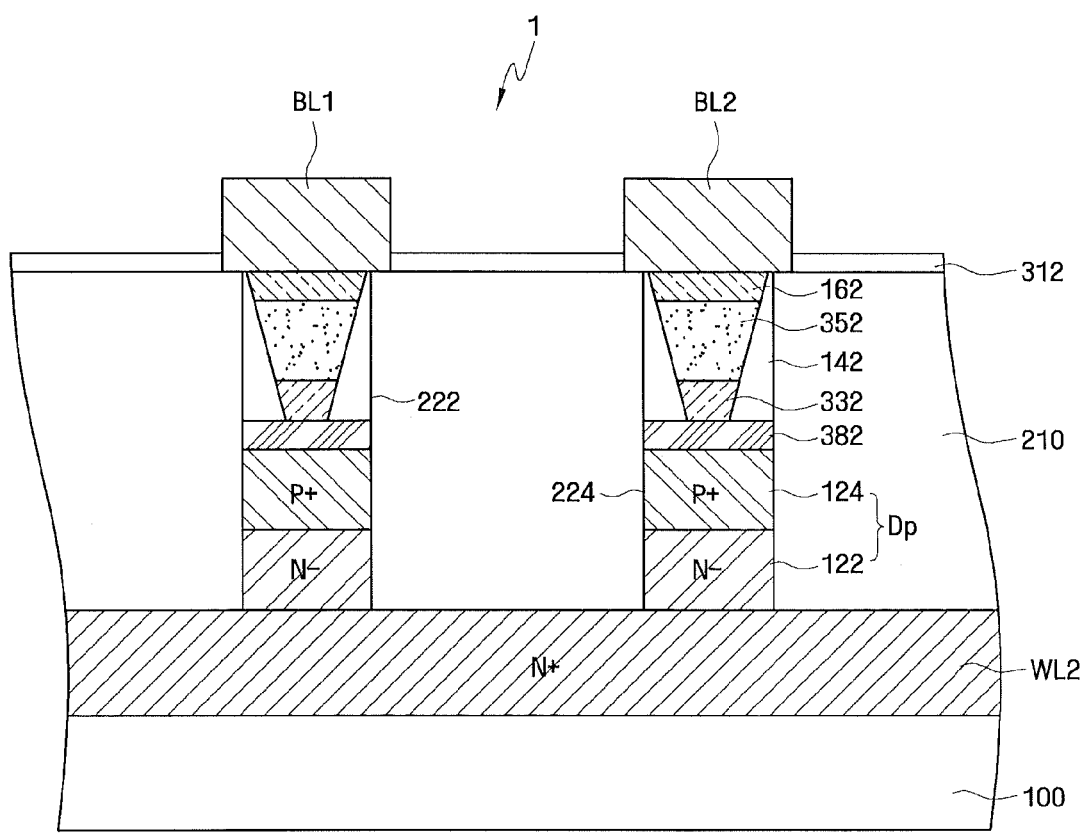
FIG. 9 is a cross-sectional view taken along the line II-II' of FIG. 3 illustrating the phase change memory device according to the third embodiment of the present inventive subject matter.

A phase change memory device according to a third embodiment of the present inventive subject matter will now be described with reference to FIGS. 3, 8A and 9. FIG. 8A is a cross-sectional view taken along the line I-I' of FIG. 3 illustrating a phase change memory device according to a third embodiment of the present inventive subject matter, and FIG. 9 is a cross-sectional view taken along the line II-IF of FIG. 3 illustrating the phase change memory device according to the third embodiment of the present inventive subject matter. For convenience of explanation, substantially the same functional components as those of the first embodiment are denoted by the same reference numerals and detailed descriptions thereof will be omitted.

Referring to FIGS. 8A and 9, a first electrode 332 included in a memory cell Cp of the phase change memory device according to the third embodiment of the present inventive subject matter may be positioned within a space formed by the spacer 142.

That is to say, the spacer 142 may be disposed between the sidewalls of the contact holes 222 and 224 and the first electrode 332. Here, lateral surfaces of the first electrode 332 may contact sloping surfaces of the spacer 142. Accordingly, the lateral surfaces of the first electrode 332 and the sloping surfaces of the spacer 142 may have the same profile. That is to say, a width of the first electrode 332 may gradually increase toward a phase change material layer 352.

As shown in FIGS. 8A and 9, a section of the first electrode 332 may be shaped of, for example, a trapezoid. Here, it is assumed that the section of the first electrode 332 is taken along the lengthwise direction of the contact holes 222 and 224.

In the third embodiment, the first electrode 332, the phase change material layer 352 and the second electrode 162 may be positioned within a space formed by the spacer 142. Accordingly, lateral surfaces of the first electrode 332, the phase change material layer 352 and the second electrode 162 may contact the sloping surfaces of the spacer 142. That is to say, the lateral surfaces of the first electrode 332, the phase change material layer 352 and the second electrode 162 and the sloping surfaces of the spacer 142 may have the same profile. Accordingly, the lateral surfaces of the first electrode 332, the phase change material layer 352 and the second electrode 162 may have a continuous profile.

The first electrode 332 may be made of, for example, titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON) and/or tantalum oxynitride (TaON).

Meanwhile, the memory cell Cp according to the third embodiment may further include an ohmic contact layer 382 disposed between the first electrode 332 and the vertical cell diode Dp. The ohmic contact layer 382 may improve an electrical contact characteristic between the first electrode 332 that is a conductive material and the second semiconductor pattern 124 that is a semiconducting material. The ohmic contact layer 382 may be formed of, for example, silicide.

Figure 8B:
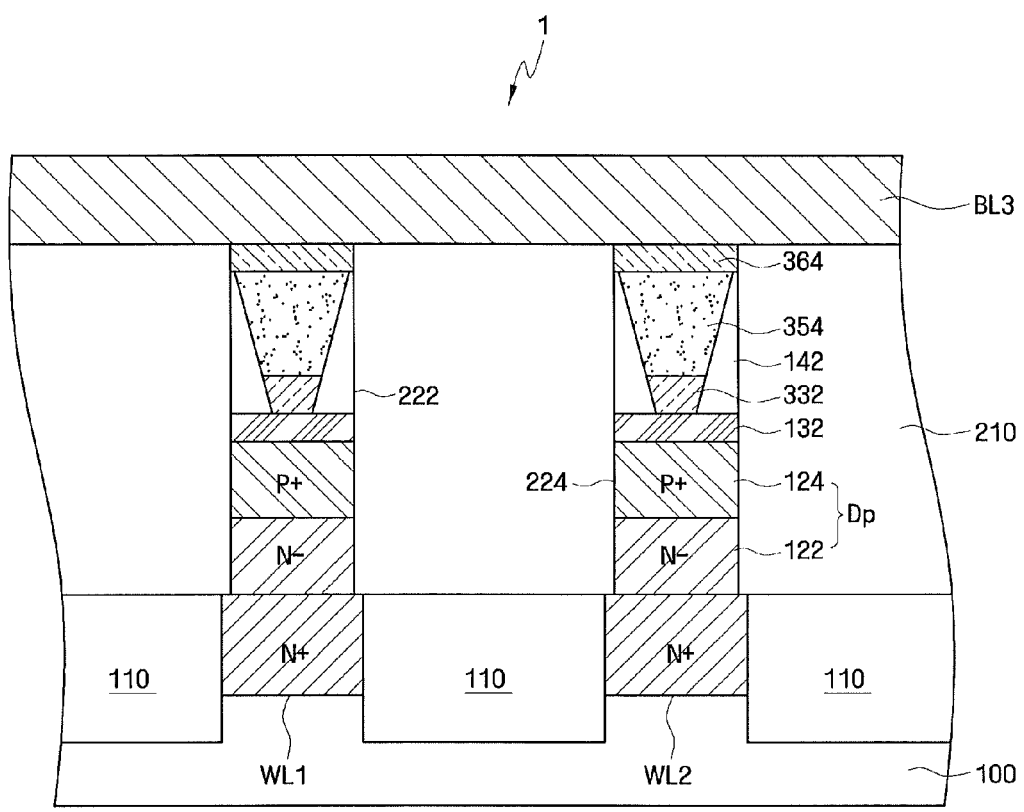
FIG. 8B is a cross-sectional view taken along the line I-I' of FIG. 3 illustrating a phase change memory device according to a fourth modification embodiment of the present inventive subject matter.

A first modification embodiment of the third embodiment of the present inventive subject matter (to be referred to as a fourth modified example, hereinafter) will be described with reference to FIGS. 3 and 8B. FIG. 8B is a cross-sectional view taken along the line I-I' of FIG. 3. For convenience of explanation, substantially the same functional components as those of the third embodiment are denoted by the same reference numerals and detailed descriptions thereof will be omitted. The phase change memory device according to the fourth modified example, as shown in FIG. 8B, basically has the same configuration as the phase change memory device according to the third embodiment except for the following differences.

Referring to FIG. 8B, unlike in the third embodiment, in the fourth modified example, the second electrode 364 is not positioned within a space formed by the spacer 142. That is to say, the spacer 142 is not disposed between the second electrode 364 and the sidewalls of the contact holes 222 and 224. Accordingly, the lateral surfaces of the second electrode 364 may directly contact the sidewalls of the contact holes 222 and 224. In addition, the second electrode 364 may be formed to have the same width as the contact holes 222 and 224.

Accordingly, the sidewalls of the contact holes 222 and 224 and the lateral surfaces of the second electrode 364 may have substantially the same profile. As shown in FIG. 8B, when sectionally viewed, the second electrode 364 may be shaped as, for example, a rectangle. Here, it is assumed that the section of the second electrode 364 is taken along the lengthwise direction of the contact holes 222 and 224.

Figure 8C:
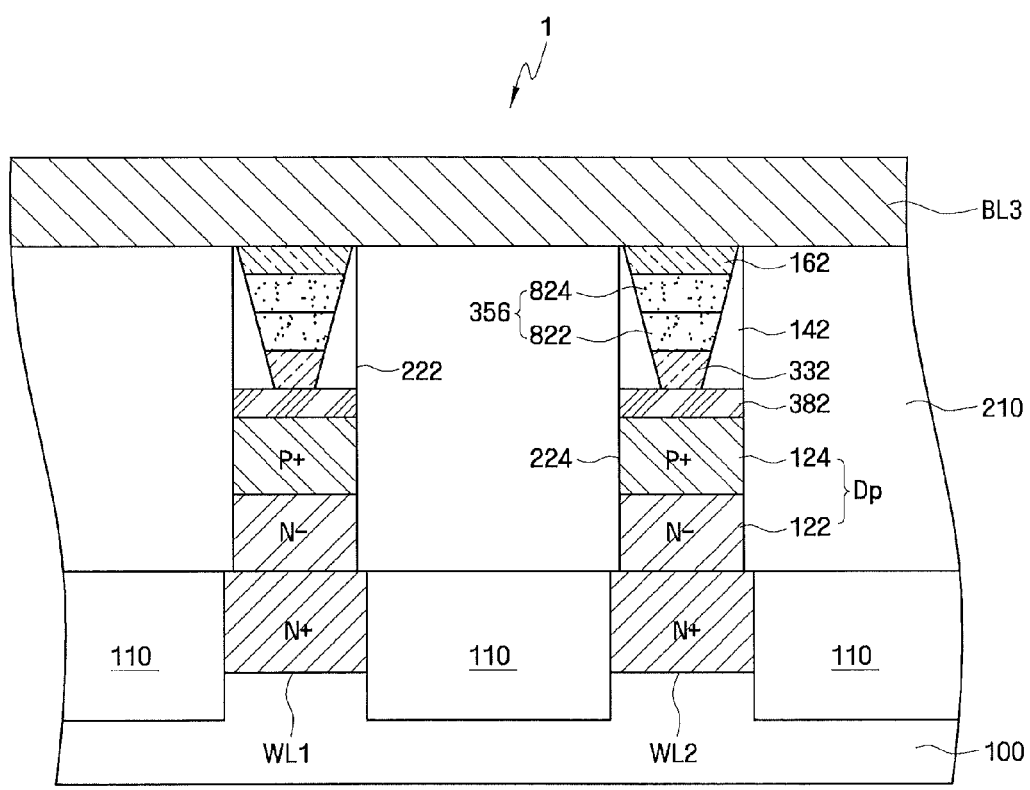
FIG. 8C is a cross-sectional view taken along the line I-I' of FIG. 3 illustrating a phase change memory device according to a fifth modification embodiment of the present inventive subject matter.

A second modification embodiment of the third embodiment of the present inventive subject matter (to be referred to as a fifth modified example, hereinafter) will be described with reference to FIGS. 3 and 8C. FIG. 8C is a cross-sectional view taken along the line I-I' of FIG. 3. For convenience of explanation, substantially the same functional components as those of the third embodiment are denoted by the same reference numerals and detailed descriptions thereof will be omitted.

The phase change memory device according to the fifth modified example, as shown in FIG. 8C, basically has the same configuration as the phase change memory device according to the third embodiment except for the following differences.

Referring to FIG. 8C, a phase change material layer 356 according to the fifth modified example may include a first phase change material pattern 822 and a second phase change material pattern 824.

Here, the first phase change material pattern 822 may include materials of various kinds, including a binary (two-element) compound, such as GaSb, InSb, InSe, SbTe, or GeTe, a ternary (three-element) compound, such as GeSbTe, GaSeTe, InSbTe, $SnSb_2Te_4$, or InSbGe, or a quaternary (four-element) compound, such as AgInSbTe, (GeSn)SbTe, GeSb (SeTe), or $Te_{81}Ge_{15}Sb_2S_2$. Specifically, a material having an amorphous state resistance value of, for example, approximately 500 kΩ or greater, may be selected as the material forming the first phase change material pattern 822. The most typically used phase-change material may include SbTe, GeBiTe, or GeSbTe doped with carbon (C) or nitrogen (N).

Meanwhile, the second phase change material pattern 824 may include materials of various kinds, including a binary (two-element) compound, such as GaSb, InSb, InSe, SbTe, or GeTe, a ternary (three-element) compound, such as GeSbTe, GaSeTe, InSbTe, $SnSb_2Te_4$, or InSbGe, or a quaternary (four-element) compound, such as AgInSbTe, (GeSn)SbTe, GeSb (SeTe), or $Te_{81}Ge_{15}Sb_2S_2$. Specifically, a material having an amorphous state resistance value of, for example, approximately 1 MΩ or greater, may be selected as the material forming the second phase change material pattern 824. The most typically used material may include GeSbTe, GeBiTe, or GeSbTe doped with carbon (C) or nitrogen (N).

During a program operation for storing data in the memory cell Cp, to allow resistance values by the first phase change material pattern 822 and the second phase change material pattern 824 to be noticeably distributed, the first phase change material pattern 822 and the second phase change material pattern 824 may be made of different materials. In particular, the first phase change material pattern 822 and the second phase change material pattern 824 may be selected so as to make the resistance value of the second phase change material pattern 824 in an amorphous state greater than that of the first phase change material pattern 822 in an amorphous state.

Alternatively, during a program operation for storing data in the memory cell Cp, to allow resistance values by the first phase change material pattern 822 and the second phase change material pattern 824 to be noticeably distributed, the first phase change material pattern 822 and the second phase change material pattern 824 may be formed to have different volumes. For example, the second phase change material pattern 824 may have a greater volume than the first phase change material pattern 822. This is for the purpose of forming the second phase change material pattern 824 having variable amorphous region sizes. Accordingly, a program region may be variably formed in the second phase change material pattern 824, thereby increasing the storage capacity of a unit cell. As described above, because the phase change material layer 356 includes the first and second phase change material patterns 822 and 824 having different properties, the memory cell Cp may achieve a multi-level cell (MLC).

As described above, in the phase change memory device according to the embodiments of the present inventive subject matter, because all elements constituting a memory cell are formed in one contact hole, it is possible to avoid misalignment, which has conventionally occurred between various elements formed in different layers. Accordingly, the overall reliability of the phase change memory device can be improved. For example, the operating current of the phase change memory device can be reduced and the life of the phase change material layer can be extended.

Figure 10:
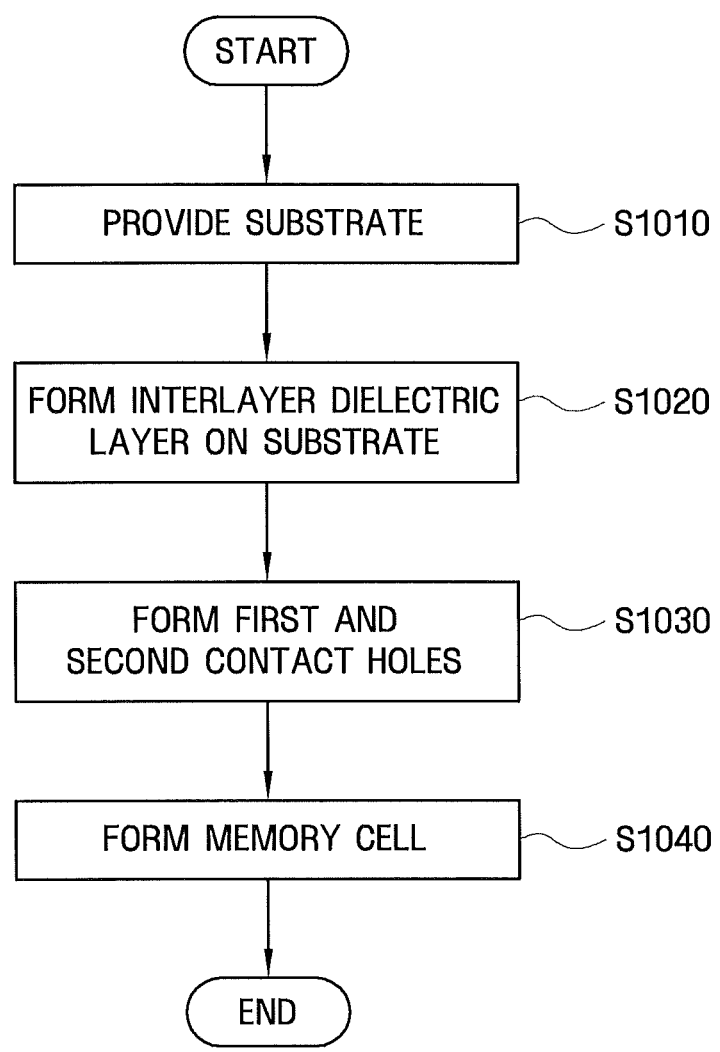
FIG. 10 is a flow chart illustrating a fabricating method of a phase change memory device according to embodiments of the present inventive subject matter.

Next, a phase change memory device according to the fourth embodiment of the present inventive subject matter will be described with reference to FIGS. 3 to 5 and FIGS. 10 to 22. FIG. 10 is a flow chart illustrating a fabricating method of a phase change memory device according to embodiments of the present inventive subject matter, and FIGS. 11 to 22 are cross-sectional views illustrating intermediate steps in a fabricating method of a phase change memory device according to a fourth embodiment of the present inventive subject matter. For convenience of explanation, substantially the same functional components as those of the first embodiment are denoted by the same reference numerals and detailed descriptions thereof will be omitted. Meanwhile, it is assumed that FIGS. 11 to 22 are cross-sectional views taken along the line II-II' of FIG. 3.

Figure 11:
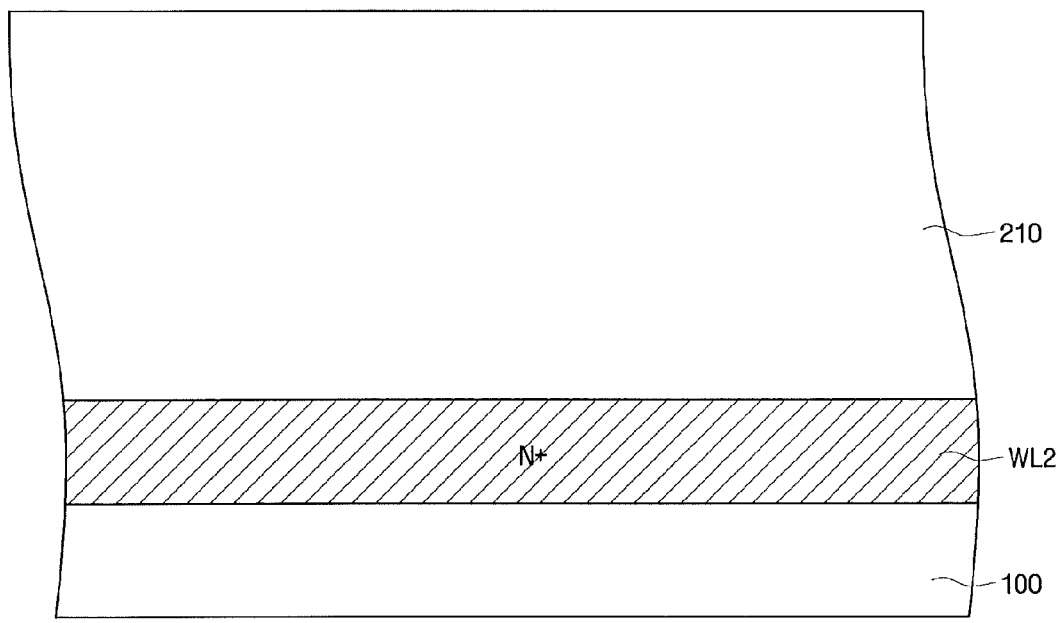
FIGS. 11 to 22 are cross-sectional views illustrating intermediate steps in a fabricating method of a phase change memory device according to a fourth embodiment of the present inventive subject matter.

Referring first to FIGS. 10 and 11, a silicon substrate 100, for example, is provided (S1010).

Next, a shallow trench isolation (STI) structure (110 of FIG. 4A) is formed in the substrate 100, and word lines WL1 and WL2 are formed at regions divided by the STI structure. The word lines WL1 and WL2 may have the same conductivity type as the substrate 100. For example, if the substrate 100 has a first conductivity type, for example, n⁻ type, the word lines WL1 and WL2 may have the same conductivity type, that is, n⁺ type.

Next, the interlayer dielectric layer 210 is formed on the substrate 100 having the word lines WL1 and WL2 (S1020). The interlayer dielectric layer 210 may be formed of, for example, silicon oxide ($SiO_x$), using chemical vapor deposition (CVD).

Figure 12:
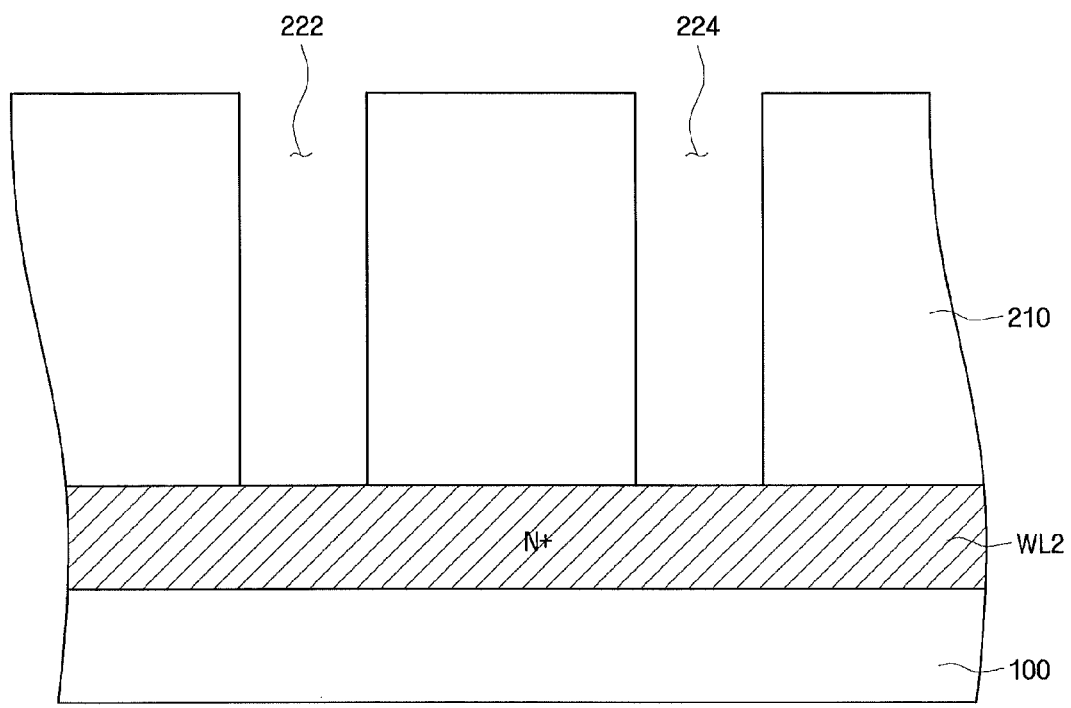

Referring to FIGS. 10 and 12, the first and second contact holes 222 and 224 are formed in the interlayer dielectric layer 210 (S1030).

The first and second contact holes 222 and 224 may be formed at a region where the memory cell Cp is formed, that is, the region overlapping the intersections of the word lines WL1 and WL2 and the bit lines BL1~BL3. Accordingly, the first and second contact holes 222 and 224 are formed while extending through the interlayer dielectric layer 210. Portions of the word lines WL1 and WL2 are exposed to the outside by the first and second contact holes 222 and 224.

Meanwhile, the first and second contact holes 222 and 224 may be spaced a predetermined distance apart and separated from the interlayer dielectric layer 210. Accordingly, the memory cells Cp formed in the first and second contact holes 222 and 224 are separated from each other. That is to say, because the first and second contact holes 222 and 224 are separated from each other, elements constituting the memory cells Cp are separated from each other. In addition, a unit memory cell Cp is formed in one contact hole 222, 224.

Figure 13:
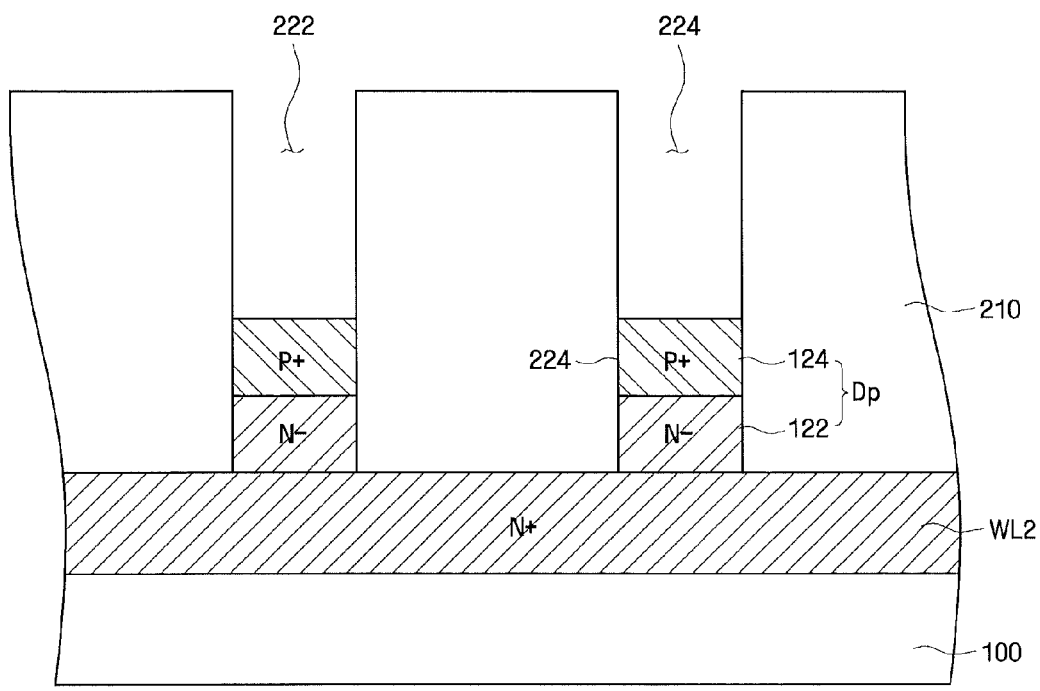

Next, referring to FIGS. 10 and 13, the first and second semiconductor patterns 122 and 124 are formed in the first and second contact holes 222 and 224, respectively, thereby forming the vertical cell diode Dp.

The first and second semiconductor patterns 122 and 124 can be formed in various manners. For example, the first and second semiconductor patterns 122 and 124 may be grown by a selective epitaxial growth (SEG) process. The first semiconductor pattern 122 may be grown using the word line WL2 exposed by the first and second contact holes 222 and 224 as a seed layer. In addition, the second semiconductor pattern 124 may be grown using the first semiconductor pattern 122 as a seed layer.

Here, in a case where the word line WL2 is single crystal, the grown first and second semiconductor patterns 122 and 124 are also single crystal. Alternatively, the first and second semiconductor patterns 122 and 124 may be formed by a solid phase epitaxial (SPE) process. Next, an impurity of a second conductivity type (for example, N type) is ion-implanted into the first semiconductor pattern 122, and an impurity of a first conductivity type (for example, P type) is ion-implanted into the second semiconductor pattern 124. In a case where the impurity is in situ doped during the SEG or SPE process, ion implantation may not be performed.

Figure 14:
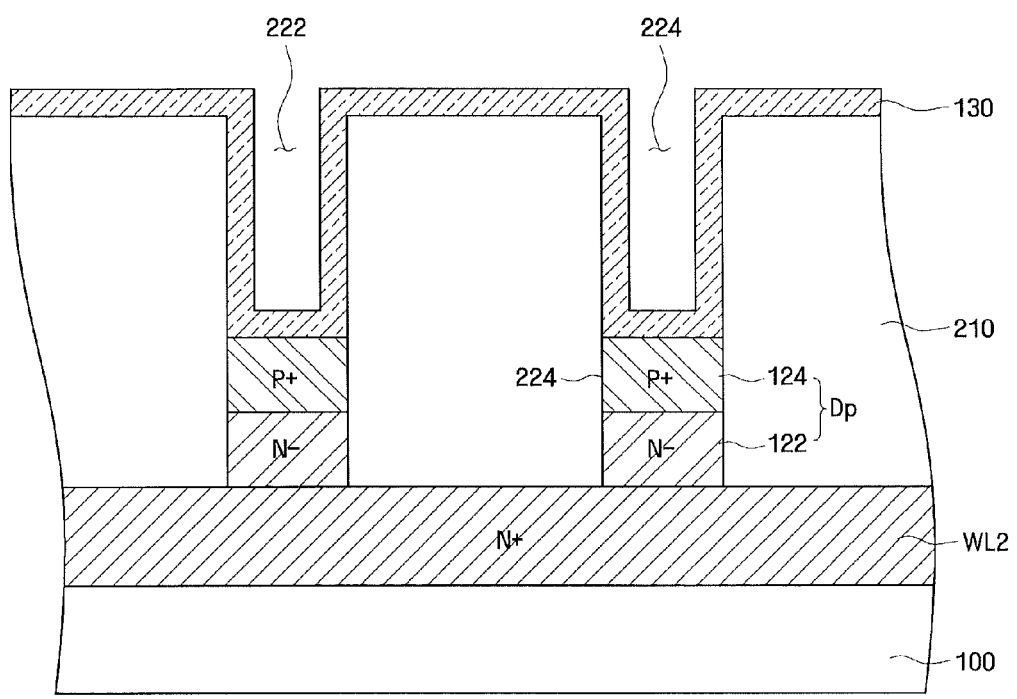

Referring to FIG. 14, a conductive layer 130 for forming a first electrode is formed on the resultant structure of FIG. 13. The conductive layer 130 may be conformally formed on a top surface of the interlayer dielectric layer 210, sidewalls of the first and second contact holes 222 and 224, and the second semiconductor pattern 124. The conductive layer 130 may be formed of, for example, titanium (Ti), using physical vapor deposition (PVD), chemical vapor deposition (CVD), atomic layer deposition (ALD), or the like.

Thereafter, a predetermined region of the conductive layer 130 positioned on the second semiconductor pattern 124 in the first and second contact holes 222 and 224 is subjected to thermal treatment under a nitrogen ($N_2$) gas atmosphere to perform silicidation so that the predetermined region of the conductive layer 130 includes titanium nitride (TiN).

Figure 15:
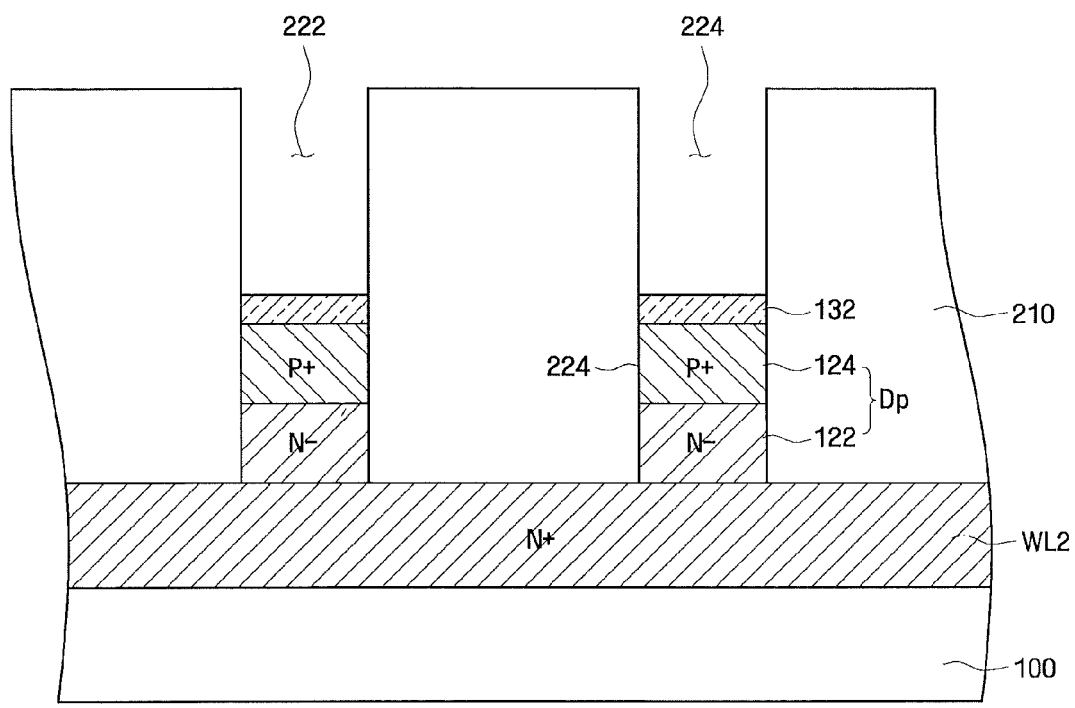

Referring to FIG. 15, a portion of the conductive layer 130, exclusive of the other portion of the conductive layer 130 overlapping the second semiconductor pattern 124 and including titanium nitride (TiN), is removed, thereby forming the first electrode 132 in the first and second contact holes 222 and 224.

Figure 16:
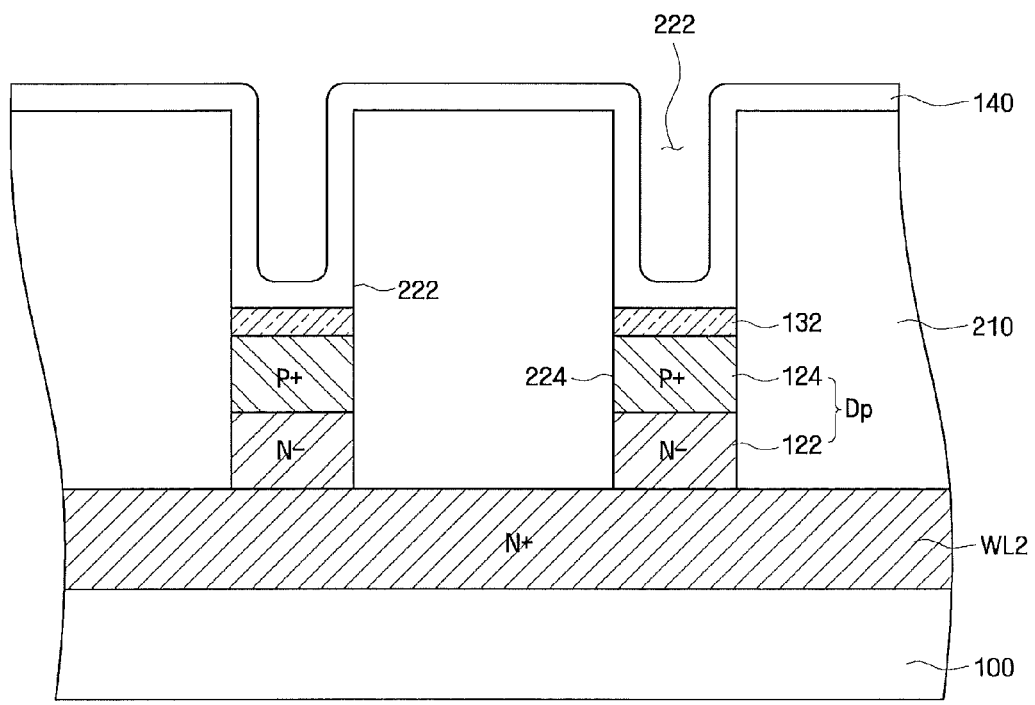

Referring to FIG. 16, a material layer 140 for forming a spacer is formed on the resultant structure of FIG. 15. The spacer forming material layer 140 may be formed of, for example, silicon oxide or silicon nitride, using CVD.

Figure 17:
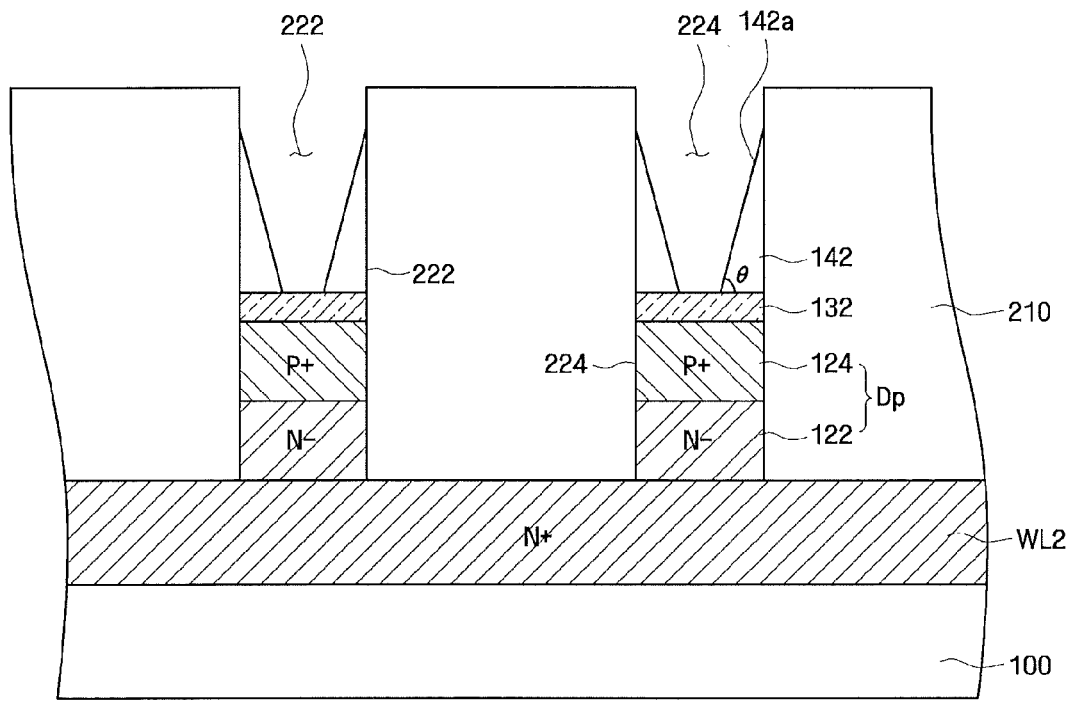

Referring to FIG. 17, the spacer forming material layer 140 is etched back to form the spacer 142 protruding from the sidewalls of the contact holes 222 and 224 toward interior portions of the contact holes 222 and 224. Here, the extent in which the spacer 142 protrudes may gradually decrease from the first electrode 132 to the second electrode 162. That is to say, the spacer 142 may have sloping surfaces 142a contacting the phase change material layer 152.

Here, the sloping surfaces 142a may form an acute angle ($\theta$) with the top surface of the first electrode 132. Here, the acute angle $\theta$ may be 80° or less. If the acute angle $\theta$ exceeds 80°, a gap-fill characteristic may deteriorate when the phase change material layer 152 is formed in the contact holes 222 and 224, thereby forming undesirable voids or seams in the phase change material layer 152. Accordingly, the phase change material layer 152 may demonstrate a non-uniform resistance dispersion, thereby lowering the reliability of the phase change memory device 1.

When sectionally viewed, the spacer 142 may be shaped as, for example, a right-angled triangle having the sloping surfaces 142a as hypotenuses and the sidewalls of the contact holes 222 and 224 as a height. Here, it is assumed that the section of the spacer 142 is taken along the lengthwise direction of the contact holes 222 and 224.

Alternatively, the spacer 142 may have a different shape, as shown in FIG. 17 by controlling process conditions. For example, a spacer having a double-layered stack having stepped sloping surfaces may be formed.

Figure 18:
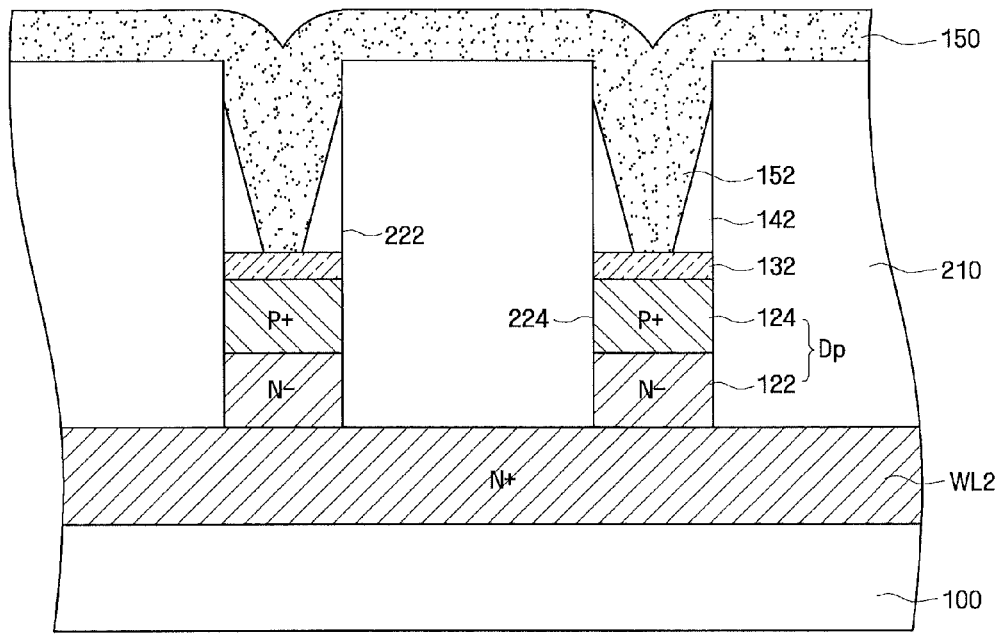

Referring to FIG. 18, the phase change material layer 150 is formed on the resultant structure of FIG. 17. Here, the phase change material layer 150 may fill the first and second contact holes 222 and 224. Accordingly, the space formed by the spacer 142 is also filled with a phase change material. Although not shown, in a case where the memory cell Cp is implemented as a multi-level cell, as shown in FIG. 4C, the phase change material layer may be stacked in two layers. In this case, the phase change material layers may include phase change materials having different physical properties.

The phase change material layer 150 may be formed of, for example, GeSbTe, using physical vapor deposition (PVD), chemical vapor deposition (CVD), atomic layer deposition (ALD), or the like.

Figure 19:
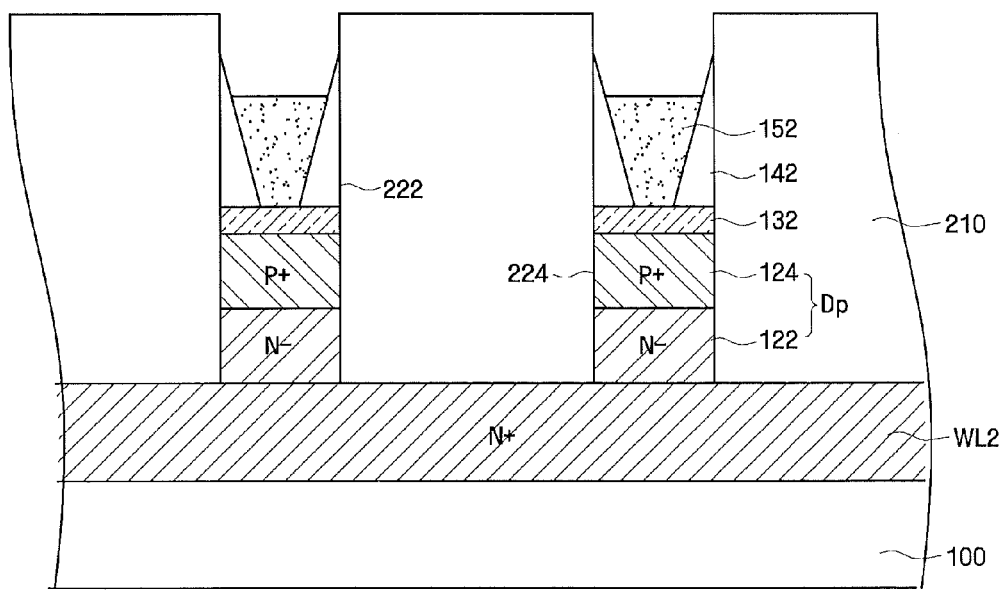

Referring to FIG. 19, a damascene process is applied to the phase change material layer 150 so that the first and second contact holes 222 and 224 are filled with a phase change material. That is to say, a node between memory cells Cp formed in the first and second contact holes 222 and 224 is divided. Thereafter, phase change material layer filling the first and second contact holes 222 and 224 is etched back, thereby forming a phase change material layer 152. Here, conditions of the etch back process are controlled to allow the phase change material layer 152 to completely fill the space formed by the spacer 142, as shown in FIG. 4B. Alternatively, as shown in FIG. 19, the phase change material layer 152 may fill the space formed by the spacer 142 exclusive of an upper portion of the space.

As described above, the phase change material layer 152 may fill the space formed by the spacer 142. Lateral surfaces of the phase change material layer 152 may contact sloping surfaces of the spacer 142. Accordingly, the lateral surfaces of the phase change material layer 152 and the sloping surfaces of the spacer 142 may have the same profile. That is to say, a width of the phase change material layer 152 may gradually increase from the first electrode 132 to the second electrode 162 to be described later. That is to say, the width of the phase change material layer 152 contacting the first electrode 132 may be smaller than that of the phase change material layer 152 contacting the second electrode 162. As shown in FIG. 19, the phase change material layer 152 may have a section shaped as, for example, a trapezoid. Here, it is assumed that the section of the phase change material layer 152 is taken along the lengthwise direction of the contact holes 222 and 224.

Figure 20:
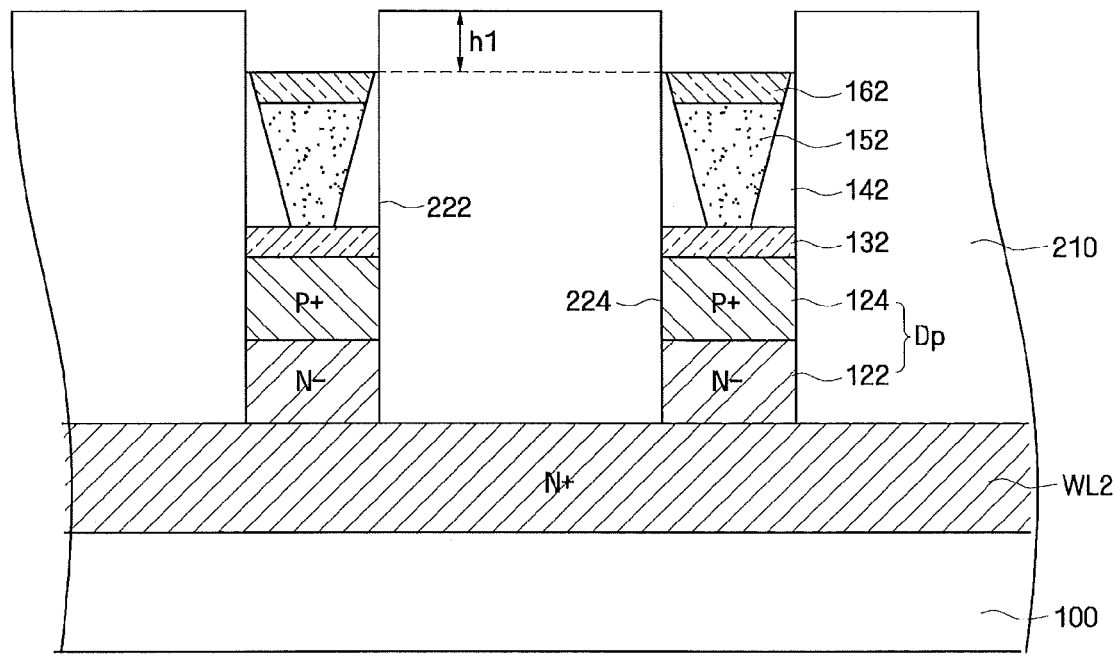

Referring to FIG. 20, a conductive layer (not shown) for forming a second electrode is formed on the resultant structure of FIG. 19. The second electrode forming conductive layer may be formed of, for example, titanium (Ti) or titanium nitride (TiN), using chemical vapor deposition (CVD) or physical vapor deposition (PVD). Here, the second electrode forming conductive layer may be formed to fill first and second contact holes 222 and 224. Thereafter, a damascene process is applied to the second electrode forming conductive layer to form a second electrode 162 in the first and second contact holes 222 and 224.

The second electrode 162 may be positioned within a space formed by the spacer 142. That is to say, the second electrode 162 may be formed such that the spacer 142 is disposed between the sidewalls of the contact holes 222 and 224 and the second electrode 162. Here, the lateral surfaces of the second electrode 162 contact the sloping surfaces of the spacer 142. Accordingly, the lateral surfaces of the second electrode 162 and the sloping surfaces of the spacer 142 may have the same profile. That is to say, a width of the second electrode 162 may gradually increase toward a top portion of the interlayer dielectric layer 210.

As shown in FIG. 20, a section of the second electrode 162 may be shaped as, for example, a trapezoid. Here, it is assumed that the section of the second electrode 162 is taken along the lengthwise direction of the contact holes 222 and 224. In this case, the lateral surfaces of the second electrode 162 and the phase change material layer 152 may have a continuous profile.

The second electrode 162 and the phase change material layer 152 may be formed such that a ratio of a thickness t2 of the second electrode 162 to a thickness t1 of the phase change material layer 152, that is, t2/t1, is equal to or less than 1. More specifically, the second electrode 162 and the phase change material layer 152 may be formed in a space extending from the first electrode 132 to top portions of the contact holes 222 and 224 such that the thickness t2 of the second electrode 162 is smaller than the thickness t1 of the phase change material layer 152 (see FIG. 4A).

Alternatively, in a case where the phase change material layer 152 is formed to fill completely the space formed by the spacer 142, the second electrode 162 may not be positioned within the space formed by the spacer 142 (see FIG. 4B).

That is to say, the second electrode 162 may be formed such that the spacer 142 is not disposed between the second electrode and the sidewalls of the contact holes 222 and 224. Accordingly, the lateral surfaces of the second electrode 162 may directly contact the sidewalls of the contact holes 222 and 224. In addition, the second electrode 162 may be formed to have the same width as the contact holes 222 and 224.

As a result of forming the second electrode 162, the memory cell Cp, including the vertical cell diode Dp, the first electrode 132, the spacer 142, the phase change material layer 152 and the second electrode 162, is formed in the first and second contact holes 222 and 224 (S1040).

Next, after forming the second electrode 162, a portion h1 of the interlayer dielectric layer 210 is removed to the top surface of the interlayer dielectric layer 210 and the top surface of the second electrode 162 are coplanarly positioned. The second electrode 162 completely fills the remaining spaces of the contact holes 222 and 224, so that the removing of the portion h1 of the interlayer dielectric layer 210 may not be required.

Figure 21:
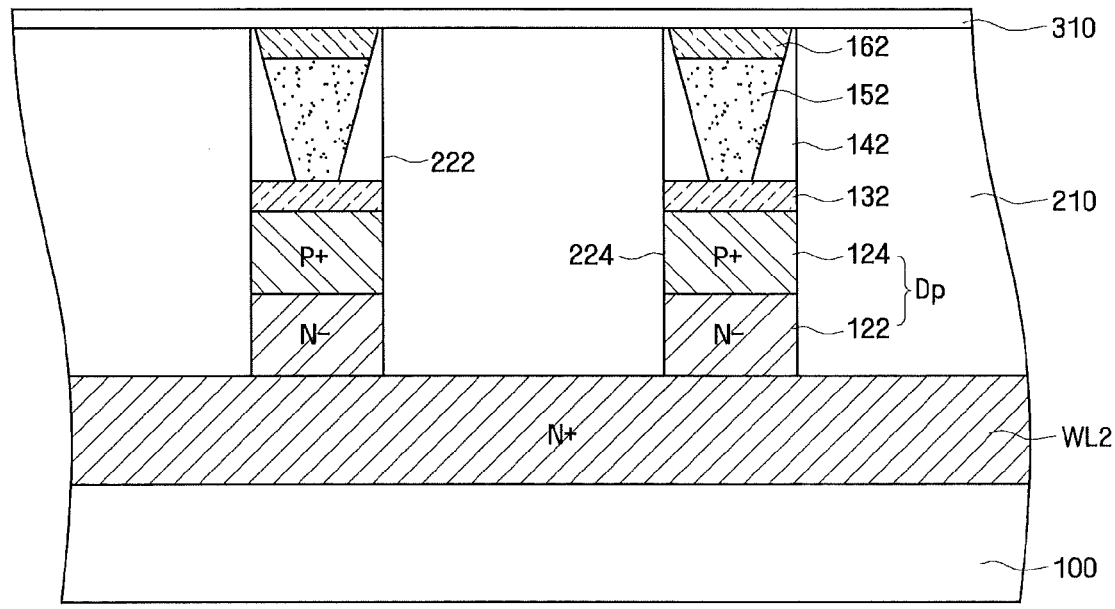
Figure 22:
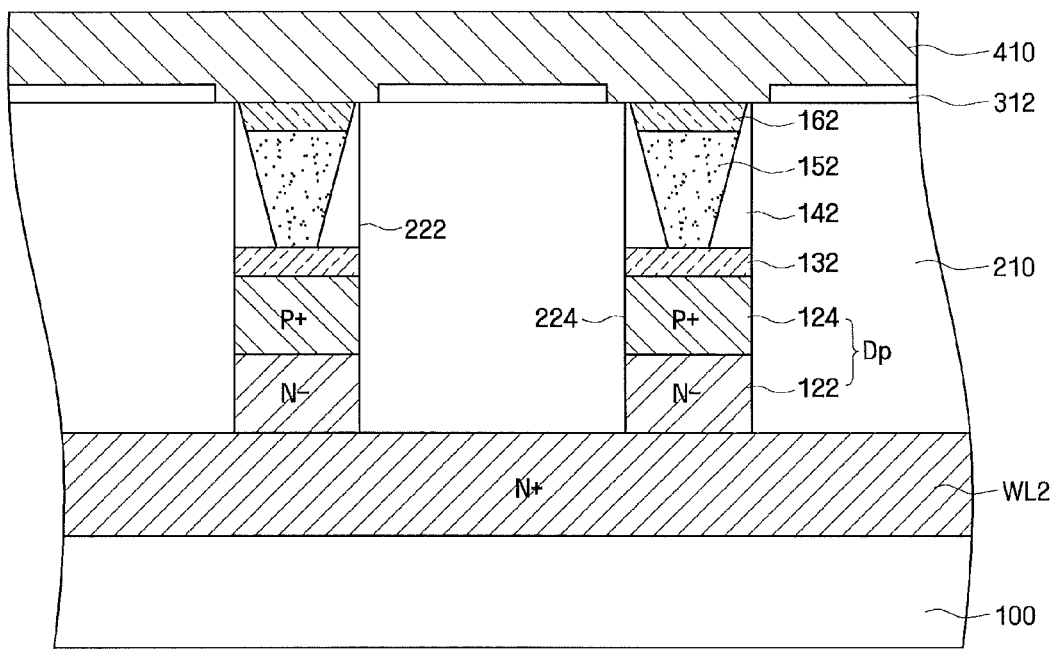

Referring to FIG. 21, an etch stop layer 310 is formed on the resultant structure of FIG. 20.

Referring to FIG. 20, a portion of the etch stop layer 310 is removed to expose the second electrode 162 of the memory cell Cp. Thereafter, a conductive layer 310 for forming a bit line is formed on the etch stop layer 310. The bit line forming conductive layer 310 may be formed of, for example, aluminum (Al), using chemical vapor deposition (CVD) or physical vapor deposition (PVD).

Thereafter, the bit line forming conductive layer 310 is patterned to intersect the word lines WL1 and WL2, thereby forming the bit lines BL1 and BL2, as shown in FIG. 5. Accordingly, the phase change memory device is completed.

Next, a fabricating method of a phase change memory device according to a sixth embodiment of the present inventive subject matter will be described with reference to FIGS. 3, 6A to 7, 10 and 23 to 27. FIGS. 23 to 27 are cross-sectional views illustrating intermediate steps in a fabricating method of a phase change memory device according to a fifth embodiment of the present inventive subject matter. For convenience of explanation, substantially the same functional components as those of the fourth embodiment are denoted by the same reference numerals and detailed descriptions thereof will be omitted. Meanwhile, it is assumed that FIGS. 23 to 27 are cross-sectional views taken along the line II-II' of FIG. 3.

Figure 23:
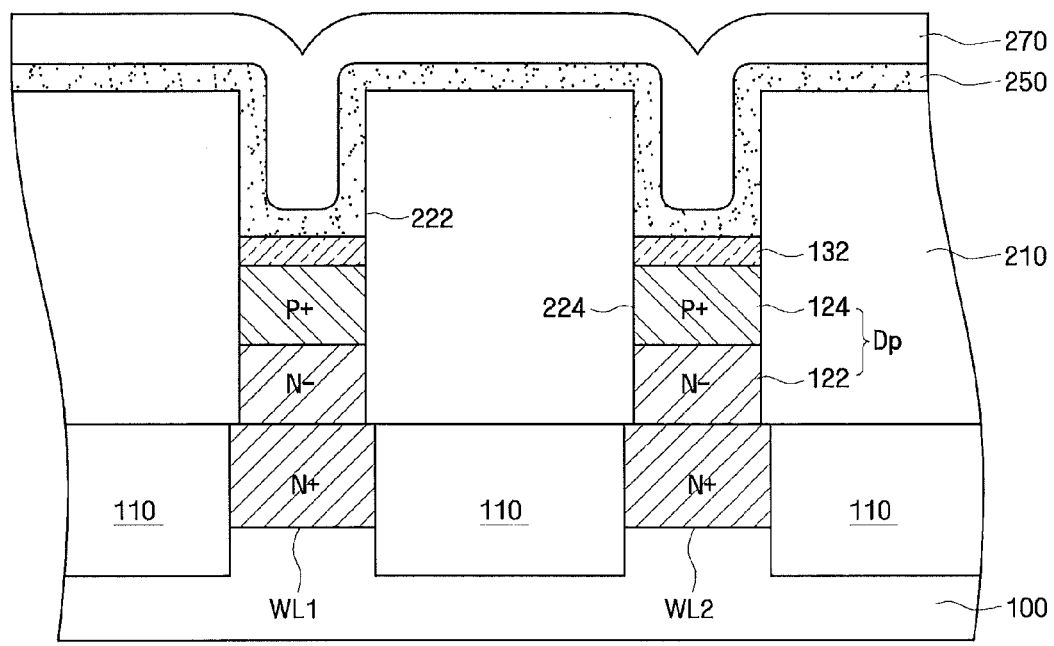
FIGS. 23 to 27 are cross-sectional views illustrating intermediate steps in a fabricating method of a phase change memory device according to a fifth embodiment of the present inventive subject matter.

Referring to FIG. 23, a phase change material layer 250 and a heat loss preventing unit forming layer 270 are sequentially stacked in the first and second contact holes 222 and 224 having the first electrode 132. Here, the phase change material layer 250 may be formed of, for example, GeSbTe, using chemical vapor deposition (CVD), atomic layer deposition (ALD), physical vapor deposition (PVD), or the like. Meanwhile, the heat loss preventing unit forming layer 270 may be formed of, for example, a low-k material, using chemical vapor deposition (CVD), atomic layer deposition (ALD), physical vapor deposition (PVD), or the like.

As shown in FIG. 6B, in a case where the heat loss preventing unit 274 includes an air gap, the heat loss preventing unit forming layer 270 may not necessarily be formed. When the heat loss preventing unit 274 is formed by the air gap, a gap-fill characteristic may be utilized when the phase change material layer 250 is filled in the contact holes 222 and 224. Specifically, when the phase change material layer 250 is filled in the first and second contact holes 222 and 224, voids are generated in the phase change material layer 250, thereby forming the air gap.

Figure 24:
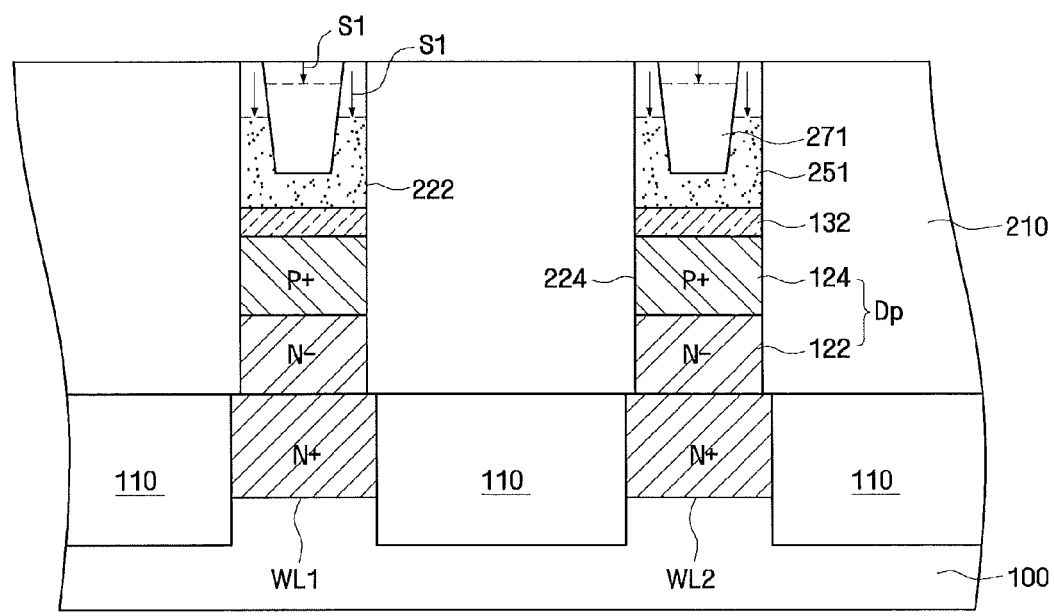
Figure 25:
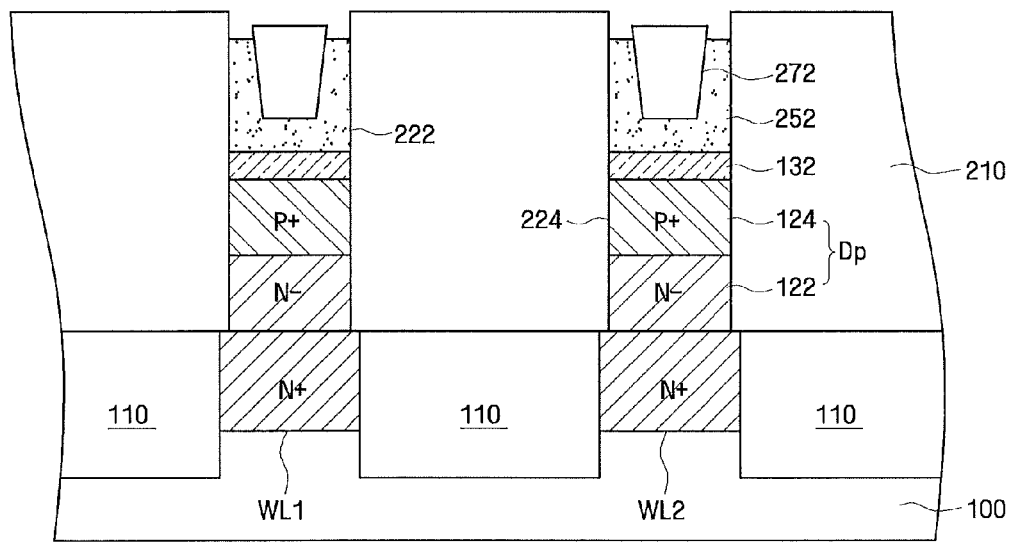

Next, referring to FIGS. 24 and 25, the phase change material layer 250 and the heat loss preventing unit forming layer 270 are etched to form the phase change material pattern 251 and the heat loss preventing unit forming pattern 271.

Thereafter, a portion S2 of the phase change material pattern 251 and a portion S1 of the heat loss preventing unit forming pattern 271 are removed using etching selectivity of the phase change material pattern 251 and the heat loss preventing unit forming pattern 271. Here, an etch rate of the phase change material pattern 251 may be higher than that of the heat loss preventing unit forming pattern 271. Accordingly, the phase change material pattern 251 may be etched more than the heat loss preventing unit forming pattern 271. Therefore, the phase change material layer 252 and the heat loss preventing unit 272 are formed.

Figure 26:
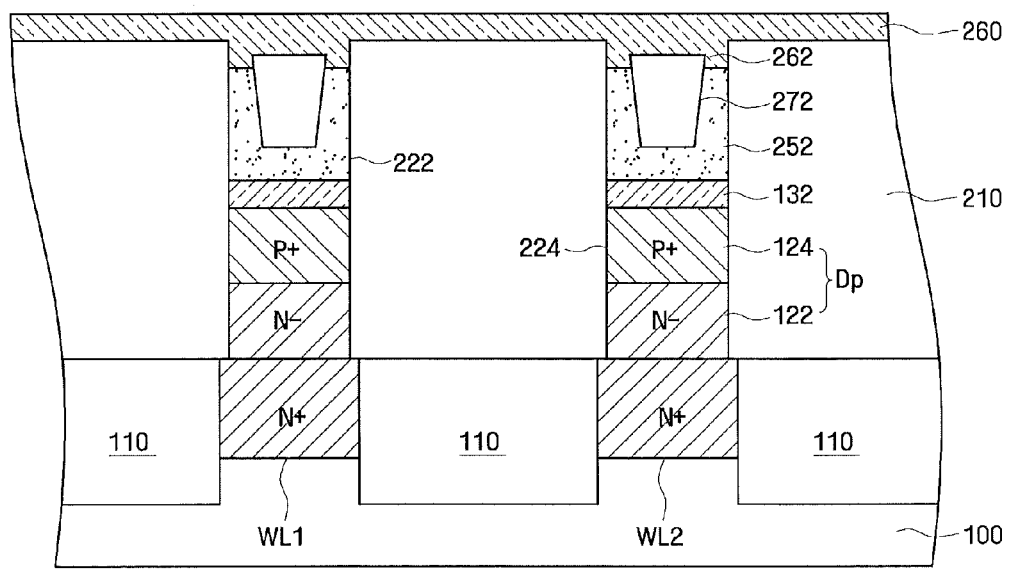

Referring to FIG. 26, the second electrode forming conductive layer 260 is formed on the resultant structure of FIG. 25. The second electrode forming conductive layer 260 may be formed of, for example, titanium (Ti) or titanium nitride (TiN), using chemical vapor deposition (CVD), physical vapor deposition (PVD), or the like.

Figure 27:
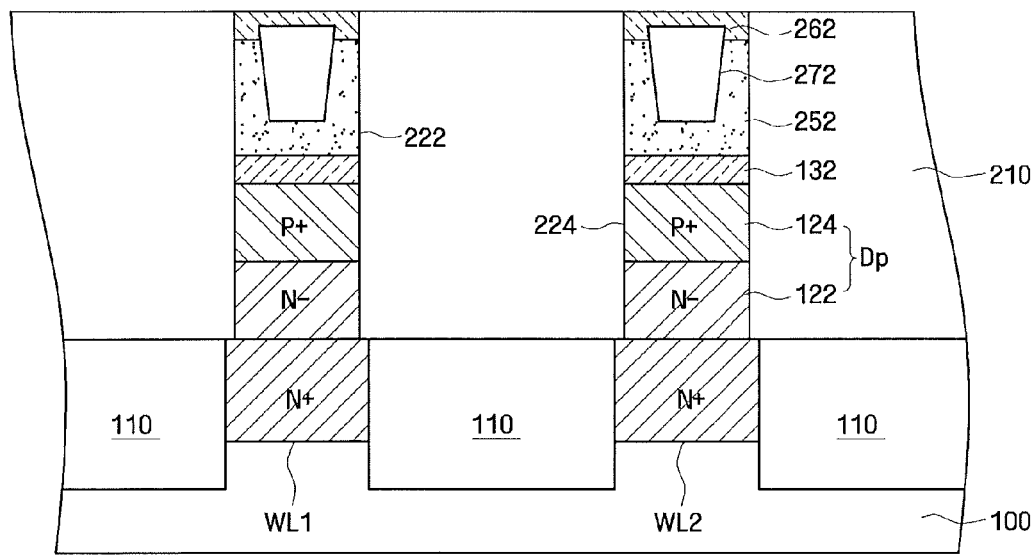

Next, referring to FIG. 27, a damascene process is applied to the second electrode forming conductive layer 260 so that the second electrode 262 is formed in the first and second contact holes 222 and 224.

Continuously, an etch stop layer is formed on the interlayer dielectric layer 210 (see FIG. 20), and bit lines BL1~BL3 connected to the second electrode 262 and intersecting with the word lines WL1 and WL2 are formed, thereby fabricating the phase change memory device.

Next, a fabricating method of a phase change memory device according to a sixth embodiment of the present inventive subject matter will be described with reference to FIGS. 3, 8A to 9, 10 and 28 to 31. FIGS. 28 to 31 are cross-sectional views illustrating intermediate steps in a fabricating method of a phase change memory device according to a sixth embodiment of the present inventive subject matter. For convenience of explanation, substantially the same functional components as those of the fourth embodiment are denoted by the same reference numerals and detailed descriptions thereof will be omitted. Meanwhile, it is assumed that FIGS. 28 to 31 are cross-sectional views taken along the line II-II' of FIG. 3.

Figure 28:
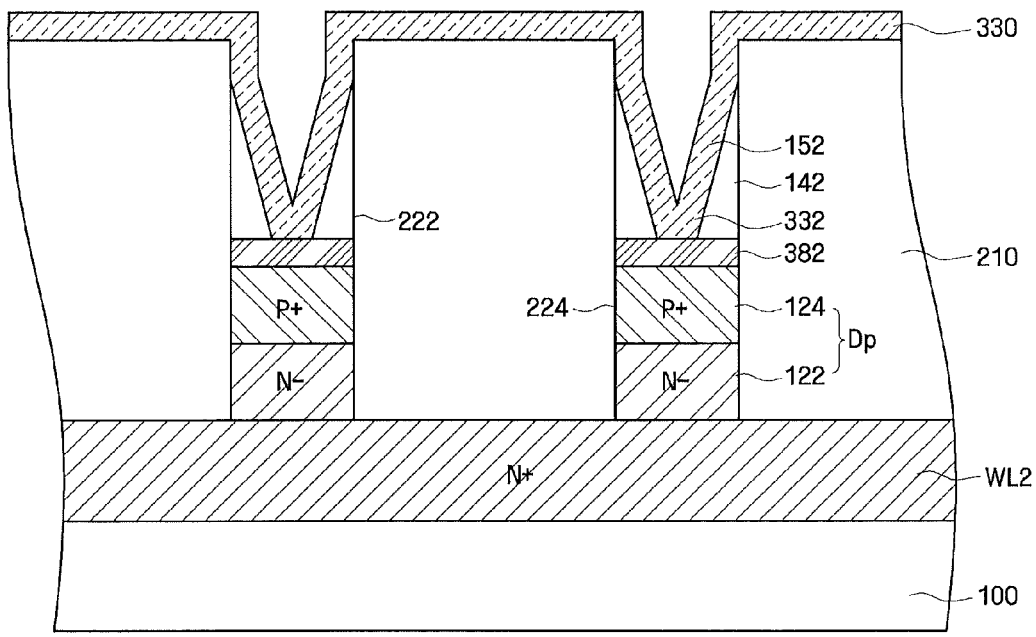
FIGS. 28 to 31 are cross-sectional views illustrating intermediate steps in a fabricating method of a phase change memory device according to a sixth embodiment of the present inventive subject matter.

Referring to FIG. 28, a first electrode forming conductive layer 330 is formed in the first and second contact holes 222 and 224 having the ohmic contact layer 382 and the spacer 142.

The conductive layer 330 may be conformally formed on a top surface of the interlayer dielectric layer 210, sidewalls of the first and second contact holes 222 and 224, sloping surfaces of the spacer 142 and the ohmic contact layer 382. The conductive layer 330 may be formed of, for example, titanium (Ti), using physical vapor deposition (PVD), chemical vapor deposition (CVD), atomic layer deposition (ALD), or the like.

Thereafter, predetermined regions of the conductive layer 330 positioned on the ohmic contact layer 382 and the sloping surfaces of the spacer 142 in the first and second contact holes 222 and 224 are subjected to thermal treatment under a nitrogen ($N_2$) gas atmosphere to perform silicidation so that the predetermined region of the conductive layer 330 includes titanium nitride (TiN).

Next, a portion of the conductive layer 330, exclusive of the other portion of the conductive layer 330 overlapping the ohmic contact layer 382 and including titanium nitride (TiN), is removed, thereby forming the first electrode 332 in the space formed by the spacer 142. Accordingly, lateral surfaces of the first electrode 332 contact sloping surfaces 142a of the spacer 142. That is to say, the lateral surfaces of the first electrode 332 and the sloping surfaces 142a of the spacer 142 may have the same profile.

Figure 29:
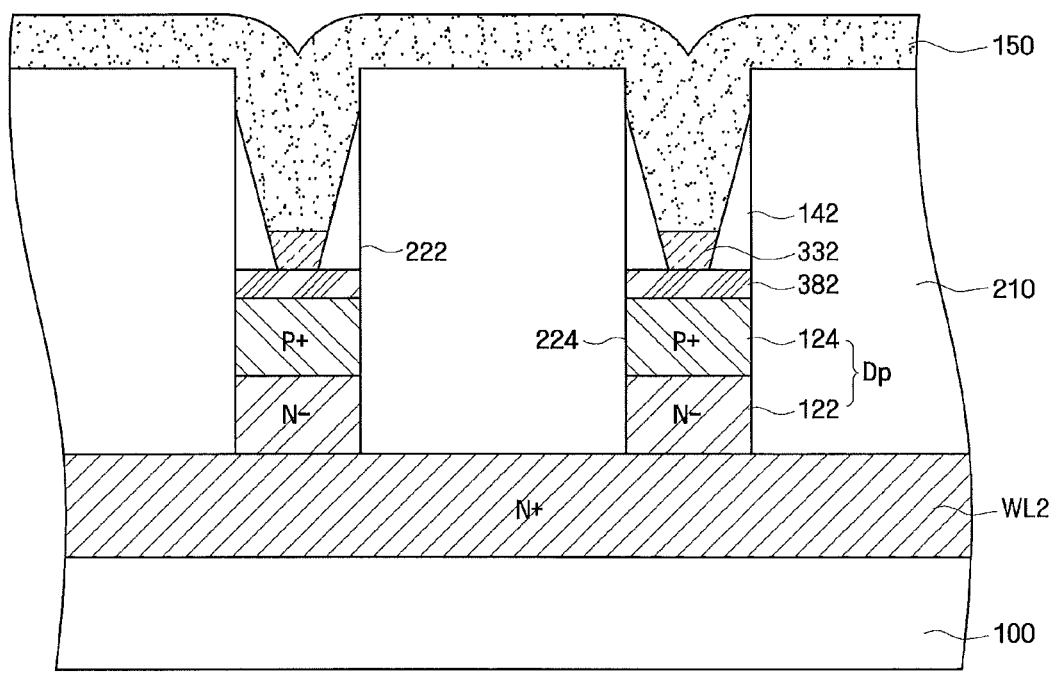

Next, referring to FIG. 29, the phase change material layer 150 is formed to fill the first and second contact holes 222 and 224. Therefore, the space formed by the spacer 142 is also filled with a phase change material. Although not shown, in a case where the memory cell Cp is implemented as a multi-level cell, as shown in FIG. 8C, the phase change material layer may be stacked in two layers. In this case, the phase change material layers may include phase change materials having different physical properties.

The phase change material layer 150 may be formed of, for example, GeSbTe, using chemical vapor deposition (CVD), atomic layer deposition (ALD), physical vapor deposition (PVD), or the like.

Figure 30:
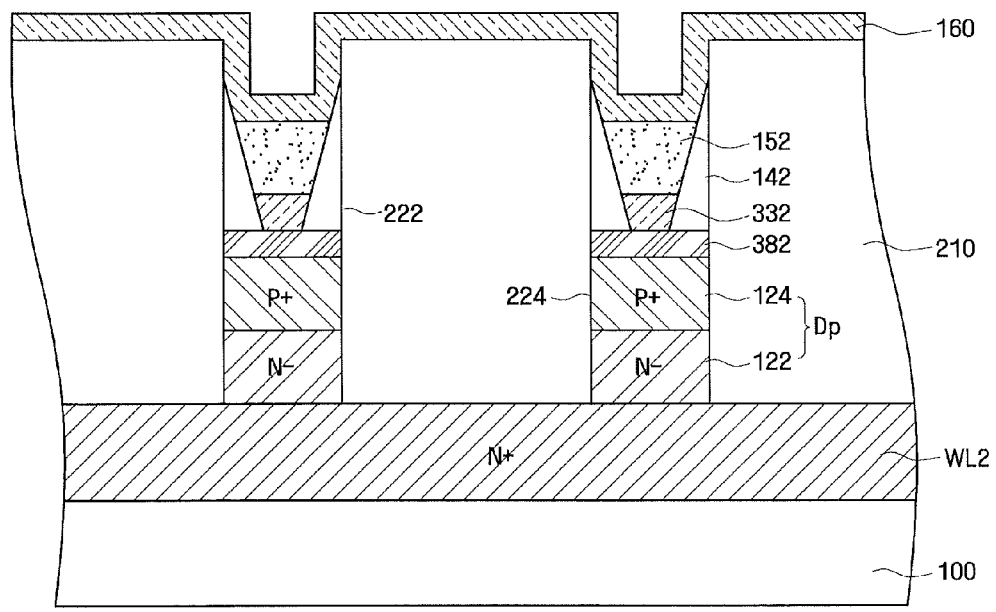

Referring to FIG. 30, a damascene process is applied to the phase change material layer 150 so that the first and second contact holes 222 and 224 are filled with a phase change material. That is to say, a node between memory cells Cp formed in the first and second contact holes 222 and 224 is divided. Thereafter, a phase change material layer filling the first and second contact holes 222 and 224 is etched back, thereby forming a phase change material layer 152. Here, conditions of the etch back process are controlled to allow the phase change material layer 152 to completely fill the space formed by the spacer 142, as shown in FIG. 8B. Alternatively, as shown in FIG. 30, the phase change material layer 152 may fill the space formed by the spacer 142 exclusive of an upper portion of the space.

As described above, the phase change material layer 152 fills the space formed by the spacer 142, while the lateral surfaces of the phase change material layer 152 contact sloping surfaces of the spacer 142. Accordingly, the lateral surfaces of the phase change material layer 152 and the sloping surfaces of the spacer 142 may have the same profile. That is to say, a width of the phase change material layer 152 may gradually increase from the first electrode 332 to the second electrode 162 to be described later. That is to say, the width of the phase change material layer 152 contacting the first electrode 332 may be smaller than that of the phase change material layer 152 contacting the second electrode 162. As shown in FIG. 30, a section of the phase change material layer 152 may be shaped of, for example, a trapezoid. Here, it is assumed that the section of the phase change material layer 152 is taken along the lengthwise direction of the contact holes 222 and 224.

Thereafter, a second electrode forming conductive layer 160 is formed on the phase change material layer 152. The second electrode forming conductive layer 160 may be formed of, for example, titanium (Ti) or titanium nitride (TiN), using chemical vapor deposition (CVD) or physical vapor deposition (PVD). Here, the second electrode forming conductive layer 160 may be formed to fill the first and second contact holes 222 and 224.

Figure 31:
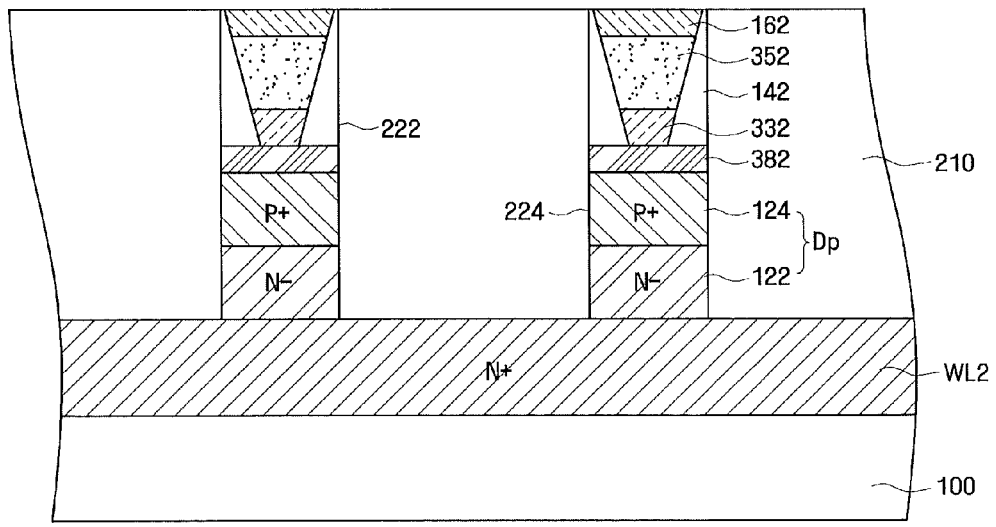

Referring to FIG. 31, a damascene process is applied to the second electrode forming conductive layer 160 so that the second electrode 162 is formed in the first and second contact holes 222 and 224.

The second electrode 162 may be positioned within the space formed by the spacer 142. That is to say, the second electrode 162 may be formed such that the spacer 142 is disposed between the sidewalls of the contact holes 222 and 224 and the second electrode 162. Here, the lateral surfaces of the second electrode 162 contact the sloping surfaces of the spacer 142. Accordingly, the lateral surfaces of the second electrode 162 and the sloping surfaces of the spacer 142 may have the same profile. That is to say, a width of the second electrode 162 may gradually increase toward a top portion of the interlayer dielectric layer 210.

Meanwhile, according to the illustrated embodiment, lateral surfaces of the first electrode 332, the phase change material layer 352 and the second electrode 162 contact the sloping surfaces of the spacer 142. That is to say, the lateral surfaces of the first electrode 332, the phase change material layer 352 and the second electrode 162 and the sloping surfaces of the spacer 142 may have the same profile.

In this case, the lateral surfaces of the second electrode 162 and the phase change material layer 352 may have a continuous profile. Accordingly, the lateral surfaces of the first electrode 332, the phase change material layer 352 and the second electrode 162 may have a continuous profile.

As shown in FIG. 31, a section of the second electrode 162 may be shaped as, for example, a trapezoid. Here, it is assumed that the section of the second electrode 162 is taken along the lengthwise direction of the contact holes 222 and 224. In this case, the lateral surfaces of the second electrode 162 and the phase change material layer 352 may have a continuous profile.

The second electrode 162 and the phase change material layer 352 may be formed such that a ratio of a thickness t2 of the second electrode 162 to a thickness t1 of the phase change material layer 352, that is, t2/t1, is equal to or less than 1. More specifically, the second electrode 162 and the phase change material layer 152 may be formed in a space extending from the first electrode 132 to top portions of the contact holes 222 and 224 such that the thickness t2 of the second electrode 162 is smaller than the thickness t1 of the phase change material layer 152 (see FIG. 8A).

That is to say, the second electrode 162 may be formed such that the spacer 142 is not disposed between the second electrode 162 and the sidewalls of the contact holes 222 and 224. Accordingly, the lateral surfaces of the second electrode 162 directly contact the sidewalls of the contact holes 222 and 224. In addition, the second electrode 162 may have the same width with the contact holes 222 and 224.

As a result of forming the second electrode 162, the memory cell Cp, including the vertical cell diode Dp, the first electrode 132, the spacer 142, the phase change material layer 152 and the second electrode 162, is formed in the first and second contact holes 222 and 224.

Continuously, an etch stop layer is formed on the interlayer dielectric layer 210 (see FIG. 20), and bit lines BL1~BL3 connected to the second electrode 262 and intersecting with the word lines WL1 and WL2 are formed, thereby fabricating the phase change memory device.

As described above, in the phase change memory device according to the embodiments of the present inventive subject matter, because all elements constituting a memory cell are formed in one contact hole, it is possible to avoid misalignment, which has conventionally occurred between various elements formed in different layers. Accordingly, the overall reliability of the phase change memory device can be improved. For example, the operating current of the phase change memory device can be reduced and the life of the phase change material layer can be extended. In addition, the diode, the first electrode, the phase change material layer and the second electrode, which are discrete elements formed in different layers, are formed in one contact hole, thereby reducing the number of masks required in the fabricating process.

Hereinafter, various data storage systems capable of incorporating a phase change memory device according to an embodiment of the present inventive subject matter shown in FIGS. 1 through 3 will be described with reference to FIGS. 32 through 36. FIGS. 32 through 36 are system diagrams illustrating various data storage systems capable of incorporating a phase change memory device according to an embodiment of the present inventive subject matter.

Figure 32:
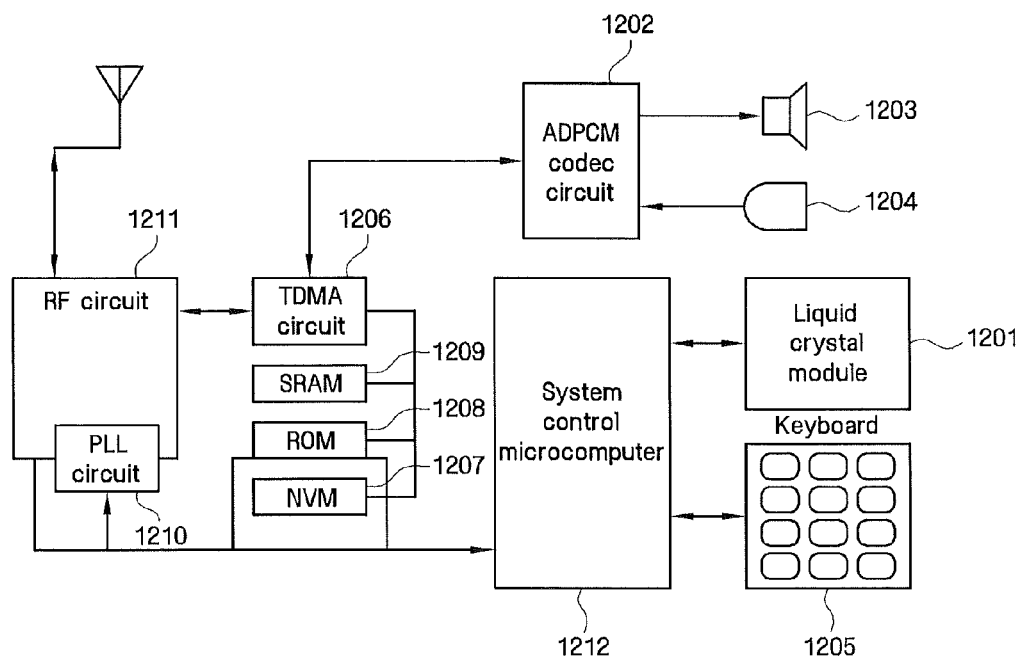
FIGS. 32 to 36 are system diagrams that illustrate various data storage systems that incorporate a phase change memory device according to some embodiments of the present inventive subject matter.

FIG. 32 is a block diagram illustrating a cellular phone system to which a phase change memory device according to embodiments of the present inventive subject matter is applied.

Referring to FIG. 32, a cellular phone system may include an ADPCM codec circuit 1202 for compressing a voice signal and decompressing a compressed voice signal, a speaker 1203, a microphone 1204, a TDMA circuit 1206 for time-division multiplexing digital data, a PLL circuit 1210 configured to set a carrier frequency of a radio frequency signal, an RF circuit 1211 configured to send and receive a radio frequency signal, and the like.

Further, the cellular phone system may include various types of memories, such as the non-volatile memory device 1207, the ROM 1208, and the SRAM 1209. The phase change memory device 1207 may be formed of a phase change memory device being a phase change memory device according to embodiments of the present inventive subject matter and used to store ID numbers. The ROM 1208 may be used to store programs, and the SRAM 1209 may be used as a work region for the system control microcomputer 1212 or/and to temporarily store data. Herein, the system control microcomputer 1212 is a processor which is configured to control write and read operations of the non-volatile memory device 1207.

Figure 33:
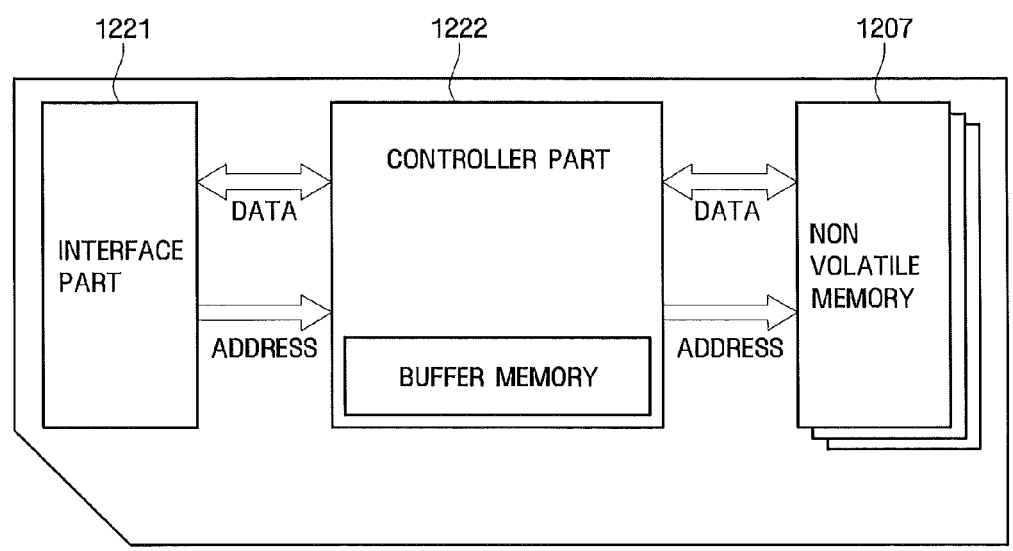

FIG. 33 is a block diagram illustrating a memory card to which a phase change memory device according to embodiments of the present inventive subject matter is applied. A memory card, for example, may be an MMC card, an SD card, a multiuse card, a micro-SD card, a memory stick, a compact SD card, an ID card, a PCMCIA card, an SSD card, a chip-card, a smartcard, a USB card, or the like.

Referring to FIG. 33, the memory card may include an interface circuit 1121 for interfacing with an external device, a controller 1122 including a buffer memory and controlling operation of the memory card, and at least one phase change memory device 1207 according to embodiments of the present inventive subject matter. The controller 1122 may be a processor, which is configured to control write and read operations of the phase change memory device 1207. In particular, the controller 1122 may be coupled with the phase change memory device 1207 and the interface circuit 1121 via a data bus DATA and an address bus ADDRESS.

Figure 34:
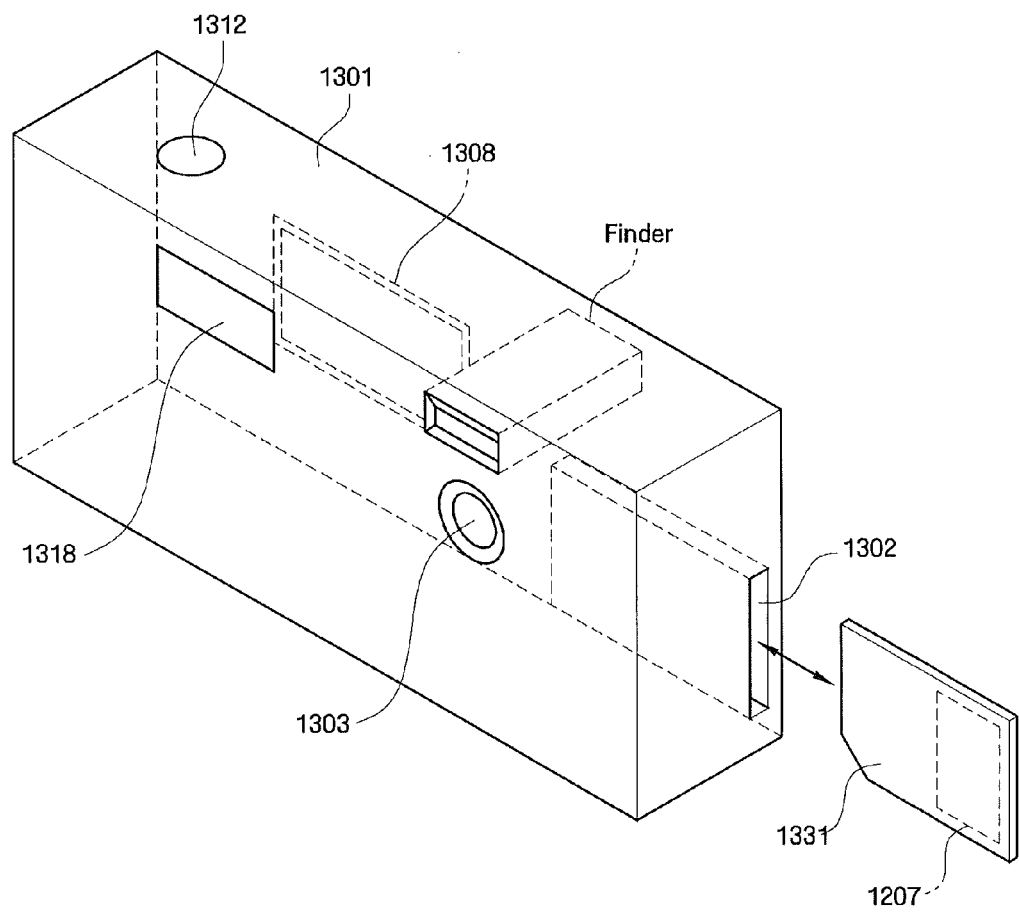

FIG. 34 is a block diagram illustrating a digital still camera to which a phase change memory device according to embodiments of the present inventive subject matter is applied.

Referring to FIG. 34, a digital still camera may include a body 1301, a slot 1302, a lens 1303, a display circuit 1308, a shutter button 1312, a strobe 1318, and the like. In particular, a memory card 1331 may be inserted in the slot 1308 and include at least one phase change memory device 1207 according to embodiments of the present inventive subject matter.

If the memory card 1331 has a contact type, an electric circuit on a circuit board may be electrically contacted with the memory card 1331 when it is inserted in the slot 1308. In the event that the memory card 1331 has a non-contact type, an electric circuit on a circuit board may communicate with the memory card 1331 in a radio-frequency manner.

Figure 35:
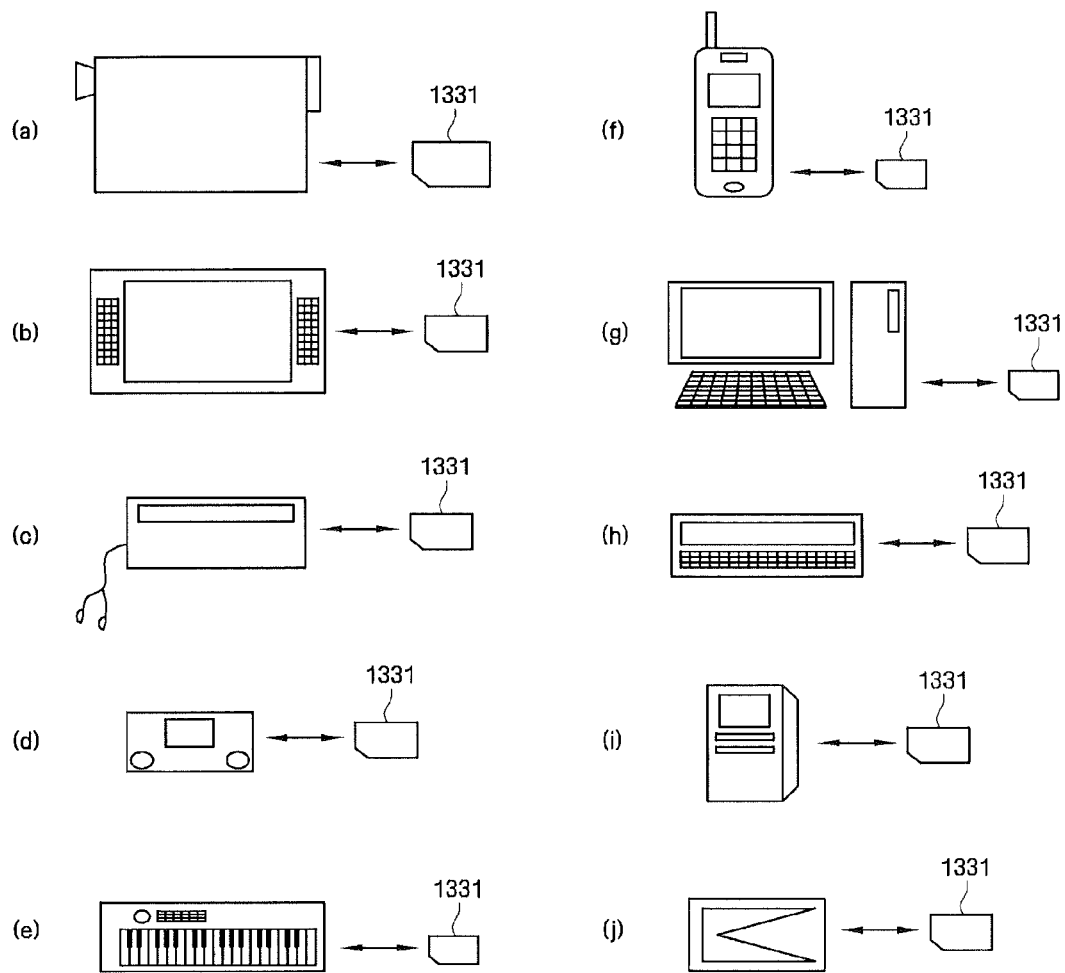

FIG. 35 is a diagram illustrating various systems to which a memory card in FIG. 33 is applied.

Referring to FIG. 35, a memory card 331 may be applied to (a) a video camera, (b) a television, (c) an audio device, (d) a game machine, (e) an electronic music device, (f) a cellular phone, (g) a computer, (h) a Personal Digital Assistant (PDA), (i) a voice recorder, (j) a PC card, and the like.

Figure 36:
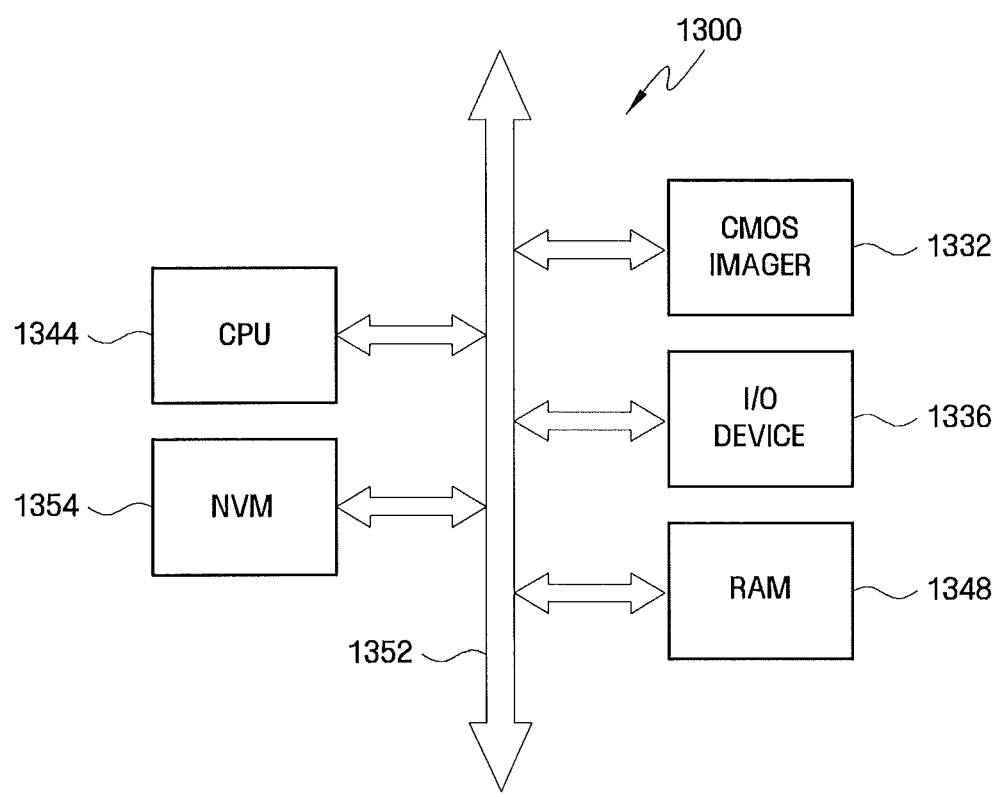

FIG. 36 is a block diagram illustrating an image sensor system to which a phase change memory device according to embodiments of the present inventive subject matter is applied.

Referring to FIG. 36, an image sensor system may include an image sensor 1332, an input/output device 1336, RAM 1348, CPU 1344, and a non-volatile memory device 1354 according to embodiments of the present inventive subject matter. Elements in FIG. 36 may communicate with one another via a bus 1352. The image sensor 1332 may include a photo sensing device such as a photo-gate, photo-diode, or the like. Elements in FIG. 36 may be formed of a single chip together with a processor or independently from the processor.

The foregoing embodiments are presented as teaching examples. Those of ordinary skill in the art will understand that various changes in form and details may be made to the embodiments without departing from the scope of the present inventive subject matter as defined by the following claims.

That which is claimed:

1. A phase change memory device comprising:
a substrate;
an interlayer dielectric layer formed on the substrate;
first and second contact holes formed in the interlayer dielectric layer; and
memory cells formed in the first and second contact holes, respectively, and each of the memory cells comprising a diode, a first electrode on the diode, a phase change material layer on the first electrode, and a second electrode on the phase change material layer,
wherein the first contact hole and the second contact hole are spaced apart from and separated from each other;
wherein each of the memory cells further comprises a spacer disposed between sidewalls of the contact hole and the phase change material layer;
wherein the spacer includes a sloping surface, and the sloping surface and the first electrode form an acute angle.

2. The phase change memory device of claim 1, wherein a width of the phase change material layer increases gradually from the first electrode to the second electrode.

3. The phase change memory device of claim 1, wherein the spacer is disposed between the second electrode and the sidewalls of the contact holes.

4. The phase change memory device of claim 3, wherein a width of the second electrode increases gradually toward an upper portion of the interlayer dielectric layer.

5. The phase change memory device of claim 1, wherein the spacer is disposed between the first electrode and the sidewalls of the contact holes.

6. The phase change memory device of claim 5, wherein a width of the first electrode gradually increases from the diode to the phase change material layer.

7. The phase change memory device of claim 1, wherein a ratio of a thickness of the second electrode to a thickness of the phase change material layer is less than or equal to 1.

8. The phase change memory device of claim 1, wherein each of the memory cells further comprises a heat loss preventing unit positioned in the phase change material layer.

9. The phase change memory device of claim 8, wherein a top portion of the heat loss preventing unit is surrounded by the second electrode and a bottom portion of the heat loss preventing unit is surrounded by the phase change material layer.

10. The phase change memory device of claim 9, wherein the heat loss preventing unit comprises boron-doped silicon oxide (BSG), phosphorous-doped oxide (PSG), boron and phosphorous-doped oxide (BPSG), carbon-doped silicon oxide, hydrogen silsesquioxane (HSQ), methylsilsesquioxane (MSQ), SILK, polyimide, polynorbornene, polymer dielectric material, and/or a low-k material.

11. The phase change memory device of claim 8, wherein the heat loss preventing unit is positioned in the phase change material layer and comprises an air gap having a surface surrounded by the phase change material layer.

12. The phase change memory device of claim 1, wherein the second electrode and the first and second contact holes have the same width.

13. The phase change memory device of claim 1, wherein the phase change material layer comprises a first phase change material pattern and a second phase change material pattern, and a volume of the second phase change material pattern is different from that of the first phase change material pattern.

14. A phase change memory device comprising:
a substrate;
an interlayer dielectric layer formed on the substrate;
first and second contact holes formed in the interlayer dielectric layer; and memory cells formed in the first and second contact holes, respectively, and each of the memory cells comprising a diode, a first electrode on the diode, a phase change material layer on the first electrode, a second electrode on the phase change material layer, and a resistance adjusting unit that adjusts resistance between the first electrode and the phase change material layer and has sloping surfaces, wherein the first contact hole and the second contact hole are spaced apart from and separated from each other and the lateral surfaces of the phase change material layer and the sloping surfaces of the resistance adjusting unit have a same profile;

wherein the resistance adjusting unit has a space to receive the phase change material layer and the second electrode, and the phase change material layer and the second electrode are positioned within the space; and wherein the lateral surfaces of the second electrode and the sloping surfaces of the resistance adjusting unit have substantially the same profile.

15. The phase change memory device of claim 14, wherein the phase change material layer and the lateral surfaces of the second electrode have a continuous profile.

16. The phase change memory device of claim 14, wherein the lateral surfaces of the second electrode contact sidewalls of the contact holes.

17. The phase change memory device of claim 14, wherein the resistance adjusting unit has a space to receive the first electrode and the phase change material layer and the first electrode and the phase change material layer are positioned within the space.

18. The phase change memory device of claim 17, wherein the lateral surfaces of the first electrode and the sloping surfaces of the resistance adjusting unit have substantially the same profile.

19. The phase change memory device of claim 18, wherein the second electrode is positioned within the space, and the lateral surfaces of the second electrode and the sloping surfaces of the resistance adjusting unit have substantially the same profile.

20. The phase change memory device of claim 19, wherein the first electrode, the phase change material layer and the lateral surfaces of the second electrode have a continuous profile.

21. The phase change memory device of claim 18, wherein the lateral surfaces of the second electrode contact sidewalls of the contact holes.

22. A storage system comprising:
a phase change memory device; and
a processor for controlling write and read operations of the phase change memory device,
wherein the phase change memory device comprises a substrate, an interlayer dielectric layer formed on the substrate, first and second contact holes formed in the interlayer dielectric layer, and a memory cells formed in the first and second contact holes, respectively, and each of the memory cells comprising a diode, a first electrode on the diode, a phase change material layer on the first electrode, and a second electrode on the phase change material layer, wherein the first contact hole and the second contact hole are spaced apart from and separated from each other;

wherein each of the memory cells further comprises a heat loss preventing unit positioned in the phase change material layer; and wherein a top portion of the heat loss preventing unit is surrounded by the second electrode and a bottom portion of the heat loss preventing unit is surrounded by the phase change material layer.

23. A phase change memory device comprising:
a substrate;
an interlayer dielectric layer formed on the substrate;
first and second contact holes formed in the interlayer dielectric layer; and
memory cells formed in the first and second contact holes, respectively, and each of the memory cells comprising a diode, a first electrode on the diode, a phase change material layer on the first electrode, and a second electrode on the phase change material layer,
wherein the first contact hole and the second contact hole are spaced apart from and separated from each other;
wherein each of the memory cells further comprises a spacer disposed between sidewalls of the contact hole and the phase change material layer; and
wherein a width of the phase change material layer increases gradually from the first electrode to the second electrode.

24. A phase change memory device comprising:
a substrate;
an interlayer dielectric layer formed on the substrate;
first and second contact holes formed in the interlayer dielectric layer; and
memory cells formed in the first and second contact holes, respectively, and each of the memory cells comprising a diode, a first electrode on the diode, a phase change material layer on the first electrode, and a second electrode on the phase change material layer,
wherein the first contact hole and the second contact hole are spaced apart from and separated from each other;
wherein each of the memory cells further comprises a heat loss preventing unit positioned in the phase change material layer; and
wherein the heat loss preventing unit is positioned in the phase change material layer and comprises an air gap having a surface surrounded by the phase change material layer.

* * * * *